(12) United States Patent
Amirkhany et al.

(10) Patent No.: US 8,531,206 B2
(45) Date of Patent: Sep. 10, 2013

(54) HIGH RESOLUTION OUTPUT DRIVER

(75) Inventors: Amir Amirkhany, Sunnyvale, CA (US); Chaofeng Huang, San Jose, CA (US); Kambiz Kaviani, San Francisco, CA (US); Wayne D. Dettloff, Cary, NC (US); Kun-Yung Chang, Los Altos, CA (US)

(73) Assignee: Rambus Inc., Sunnyvale, CA (US)

( * ) Notice: Subject to any disclaimer, the term of this patent is extended or adjusted under 35 U.S.C. 154(b) by 0 days.

(21) Appl. No.: 13/391,383

(22) PCT Filed: Sep. 14, 2010

(86) PCT No.: PCT/US2010/048826
§ 371 (c)(1),
(2), (4) Date: Feb. 20, 2012

(87) PCT Pub. No.: WO2011/032178
PCT Pub. Date: Mar. 17, 2011

(65) Prior Publication Data
US 2012/0147944 A1    Jun. 14, 2012

Related U.S. Application Data

(60) Provisional application No. 61/242,319, filed on Sep. 14, 2009.

(51) Int. Cl.
H03K 17/16    (2006.01)
(52) U.S. Cl.
USPC .................................. 326/30; 326/87; 326/27
(58) Field of Classification Search
USPC ..................................... 326/26, 27, 30, 83–87
See application file for complete search history.

(56) References Cited

U.S. PATENT DOCUMENTS 5,001,484 A    3/1991    Weiss ............................. 341/153
5,254,883 A *  10/1993   Horowitz et al. ............... 326/30

(Continued)

FOREIGN PATENT DOCUMENTS

| EP | 1005171 | 5/2000 |
| EP | 1257102 | 11/2002 |
| WO | WO 2006-078845 | 2/2007 |

OTHER PUBLICATIONS

Dally, W.J., et al., "Digital Systems Engineering", 1998, Chapter 11, "Signaling Circuits", pp. 514-540. 29 pages.

(Continued)

*Primary Examiner* — Don Le
(74) *Attorney, Agent, or Firm* — Charles Shemwell

(57) ABSTRACT

High resolution output drivers having a relatively small number of sub-driver branches or slices each having nominal impedances substantially larger than a quantization step and that incrementally differ from one another by an impedance step substantially smaller than a quantization step. In one implementation, such "differential" or "non-uniform" sub-driver slices implement respective elements of an n choose k equalizer, with each such differential sub-driver slice being implemented by a uniform-element impedance calibration DAC. In another implementation, each component of a uniform-slice equalizer is implemented by a differential-slice impedance calibration DAC, and in yet another implementation, each component of a differential-slice equalizer is implemented by a differential-slice impedance calibration DAC. In an additional set of implementations, equalization and impedance calibration functions are implemented bilaterally in respective parallel sets of driver branches, rather than in the nested "DAC within a DAC" arrangement of the hierarchical implementations. Through such bilateral arrangement, multiplication of the equalizer and calibrator quantizations is avoided, thereby lowering the total number of sub-driver slices required to meet the specified ranges and resolutions.

26 Claims, 12 Drawing Sheets

(56) References Cited

U.S. PATENT DOCUMENTS

| | | | | |
|---|---|---|---|---|
| 6,049,300 | A | 4/2000 | Shoval | 341/144 |
| 6,304,201 | B1 | 10/2001 | Moreland et al. | 341/154 |
| 6,373,300 | B2 * | 4/2002 | Welch et al. | 327/112 |
| 7,227,382 | B1 * | 6/2007 | Talbot et al. | 326/87 |
| 7,307,447 | B2 * | 12/2007 | Clements et al. | 326/30 |
| 7,570,071 | B2 | 8/2009 | Clements et al. | 324/765 |
| 8,237,468 | B2 * | 8/2012 | Nguyen et al. | 326/82 |
| 2002/0135404 | A1 | 9/2002 | Payne et al. | 327/108 |
| 2004/0246613 | A1 | 12/2004 | Tseng | 360/1 |
| 2009/0237109 | A1 * | 9/2009 | Haig et al. | 326/30 |
| 2011/0163778 | A1 * | 7/2011 | Moon | 326/30 |
| 2011/0291698 | A1 * | 12/2011 | Ko | 326/30 |
| 2012/0025800 | A1 | 2/2012 | Dettloff | 323/299 |

OTHER PUBLICATIONS

Notification dated Dec. 14, 2010 of the International Search Report and the Written Opinion re Int'l. Application No. PCT/US2010/028871. 17 Pages.

International Search Report and the Written Opinion dated May 26, 2011 re Int'l. Application No. PCT/US2010/048826. 11 Pages.

Preliminary Amendment dated Sep. 26, 2011 re U.S. Appl. No. 13/260,549. 8 Pages.

PCT Preliminary Report mailed Oct. 6, 2011 re Int'l. Application No. PCT/US2010/028871 filed Mar. 26, 2010. 11 Pages.

International Preliminary Report on Patentability (Chapter I) and Written Opinion dated Mar. 29, 2012 re Int'l Application No. PCT/US10/048826. 8 pages.

* cited by examiner (Prior-Art)

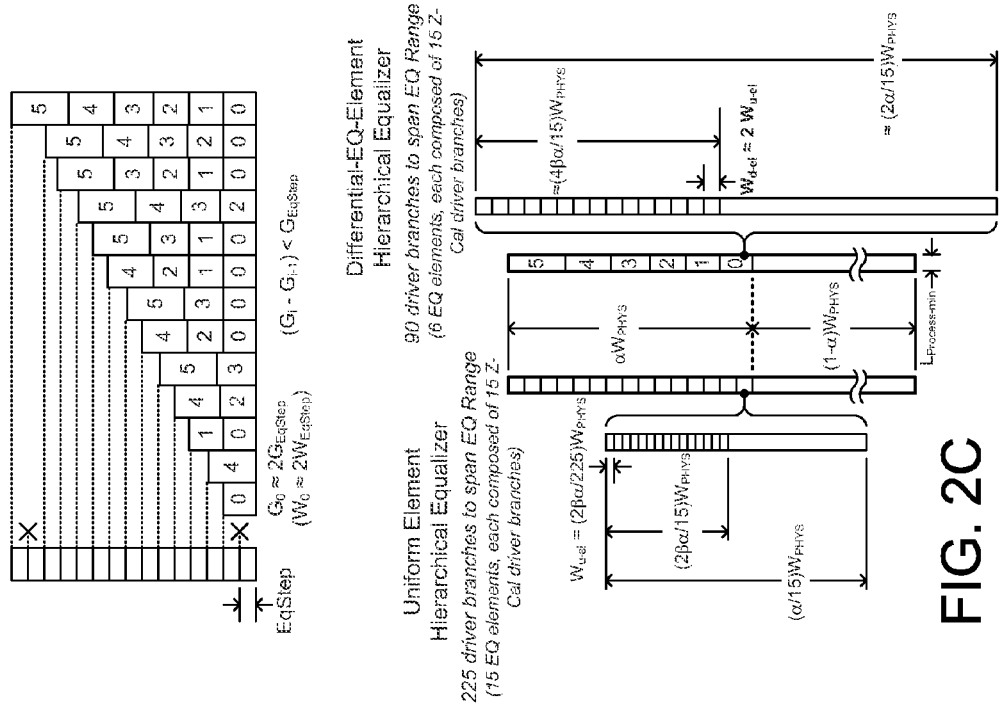
FIG. 2B
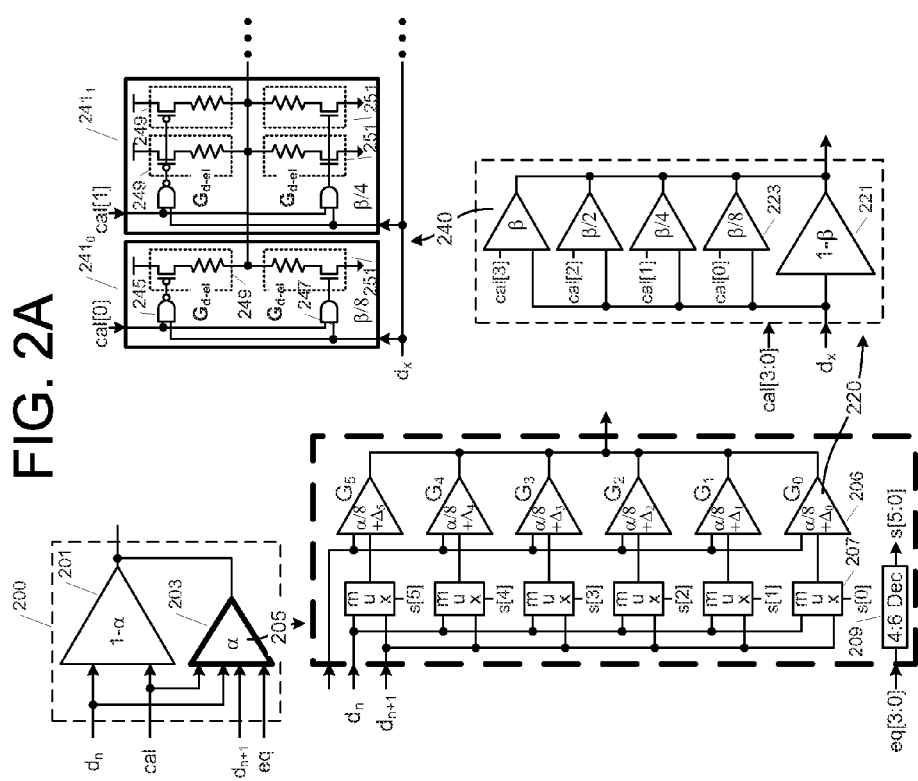
FIG. 2A
FIG. 2C

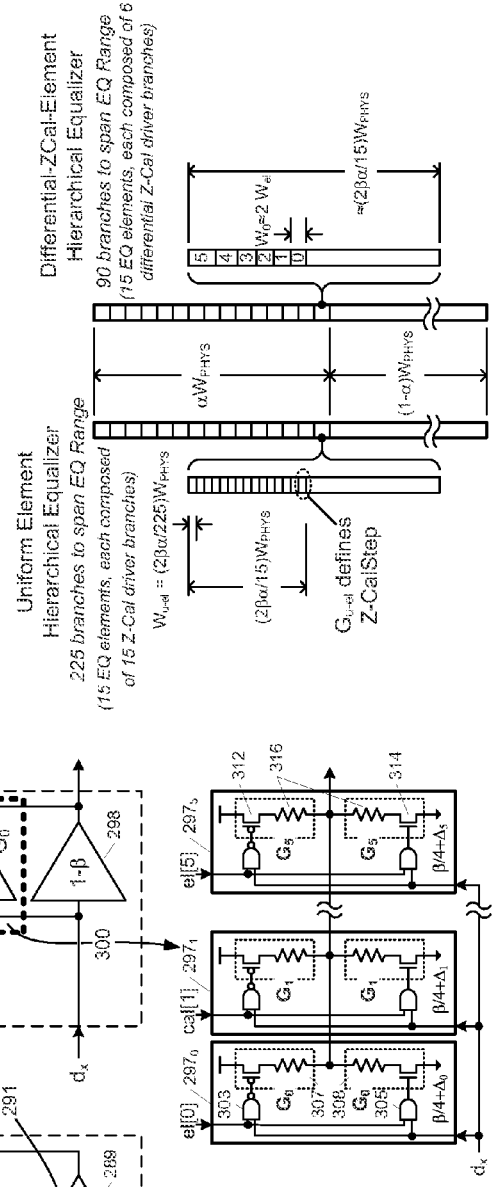
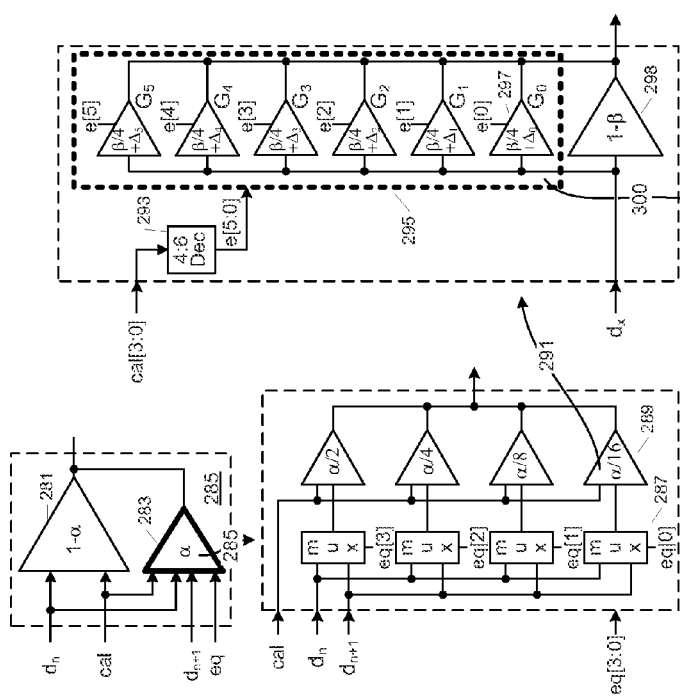
FIG. 3A
FIG. 3B
FIG. 3C

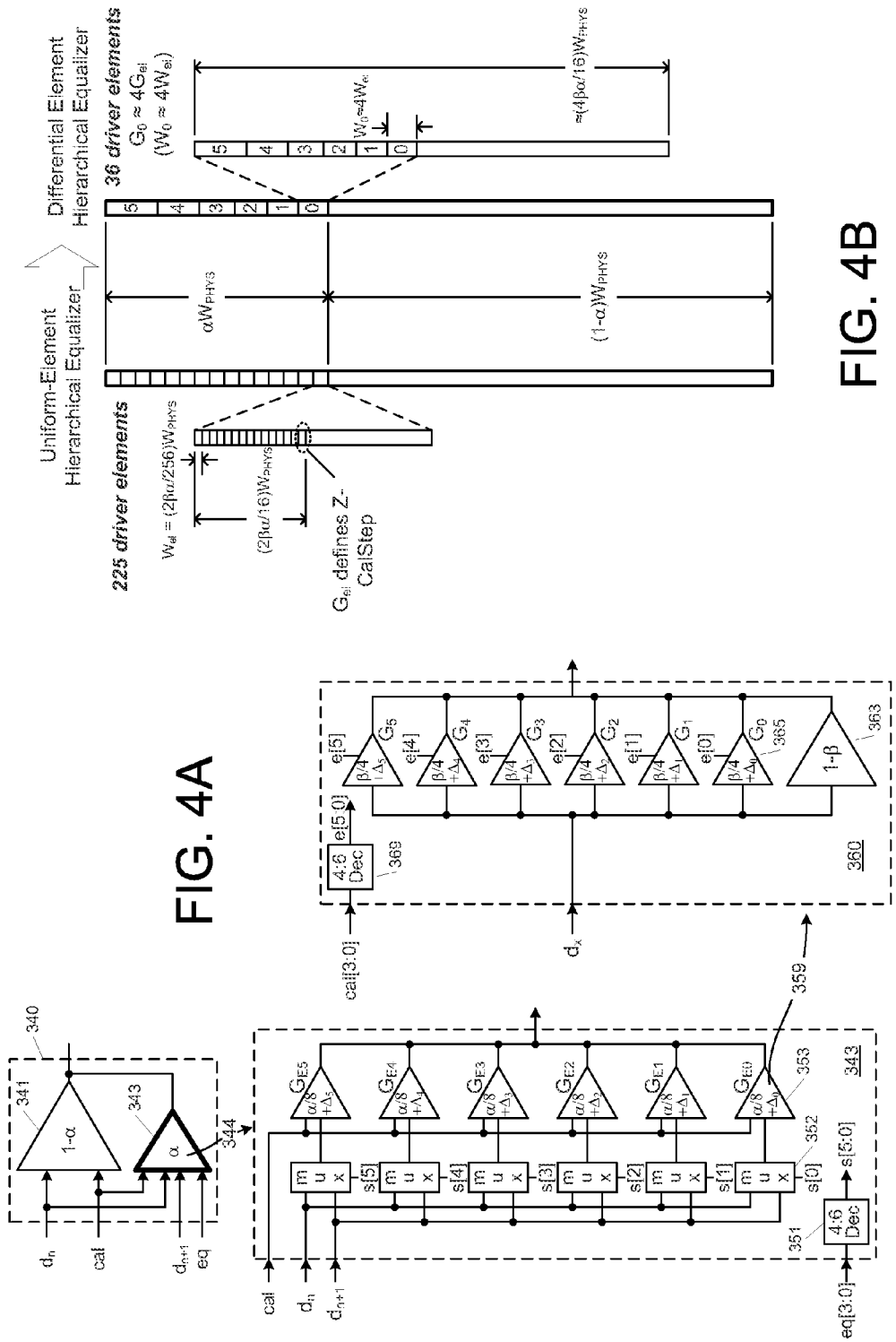

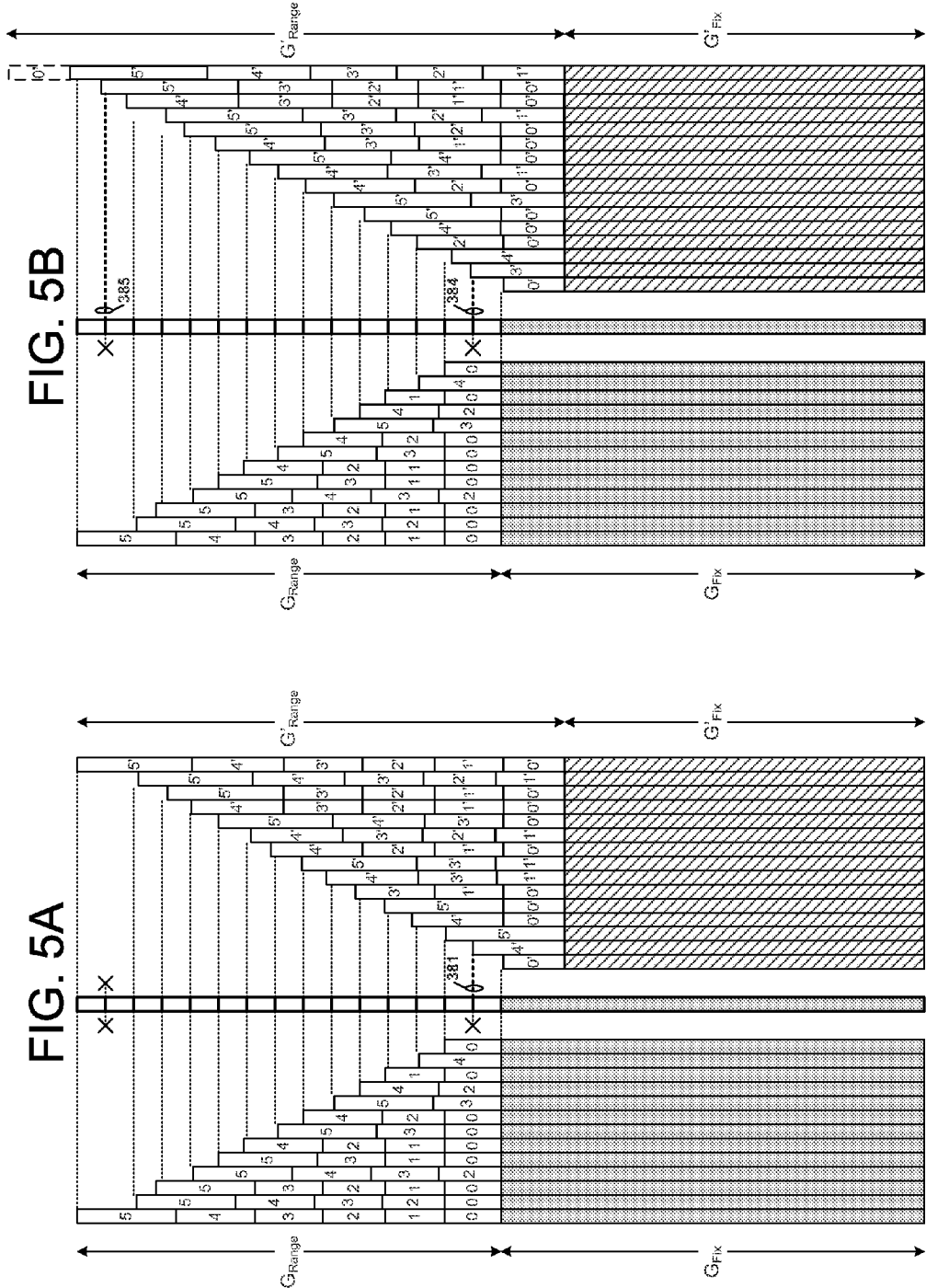

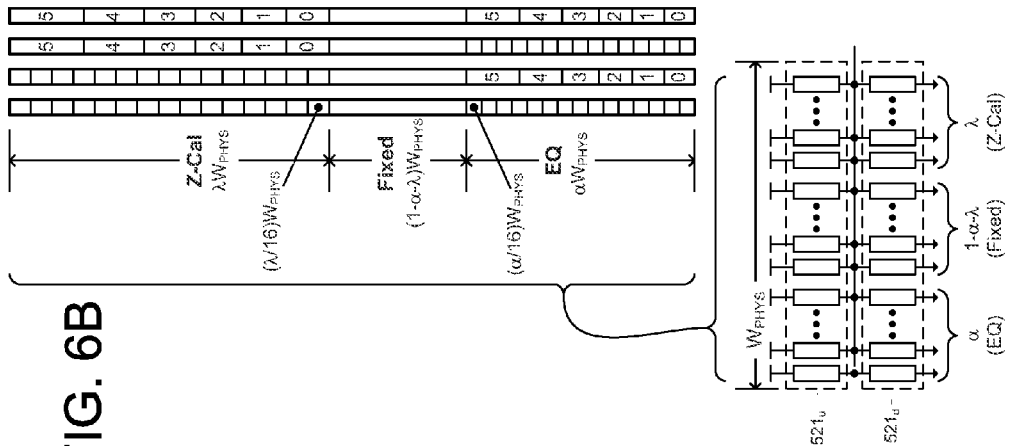
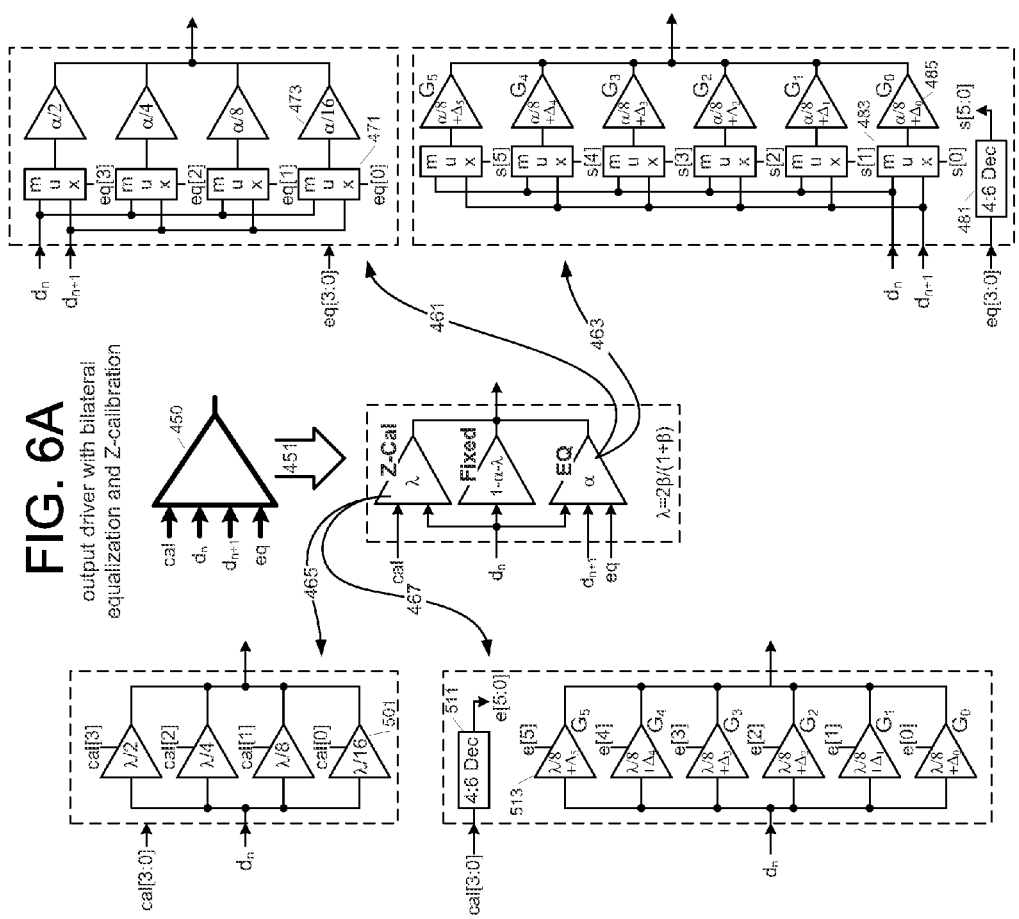

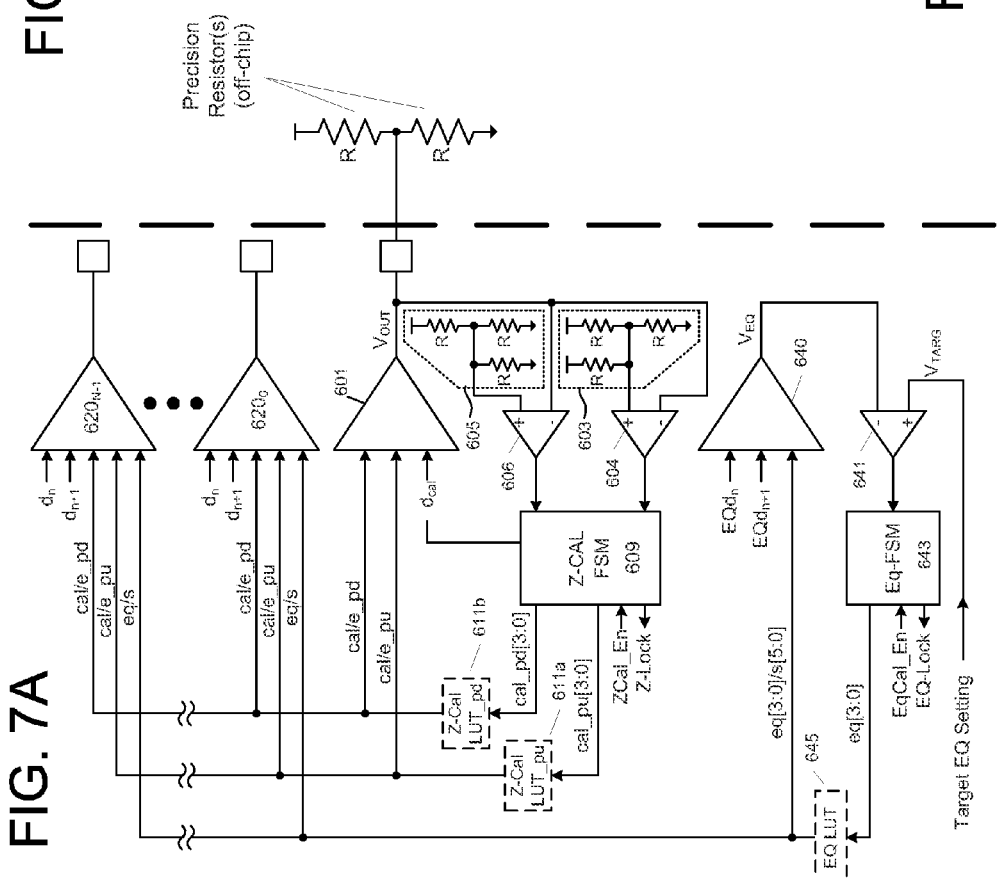

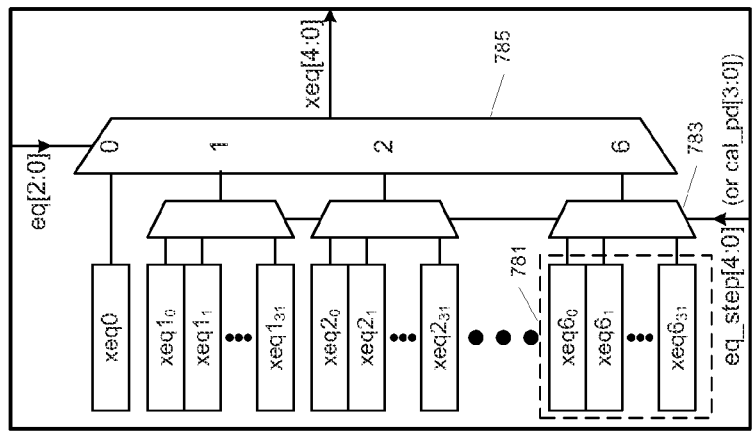
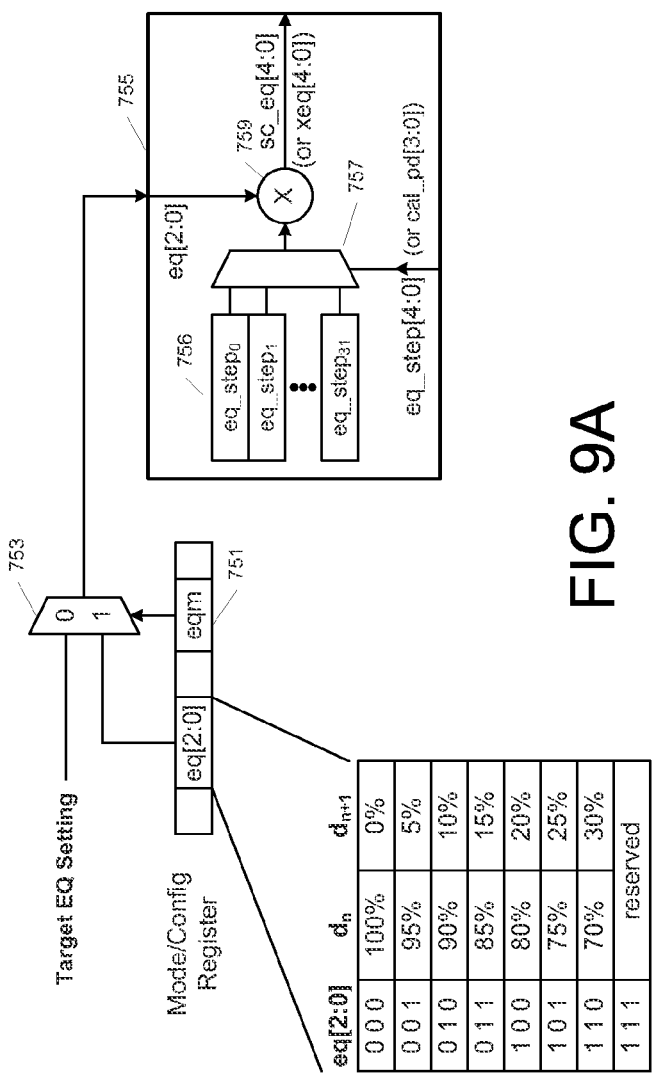
FIG. 9A
FIG. 9B

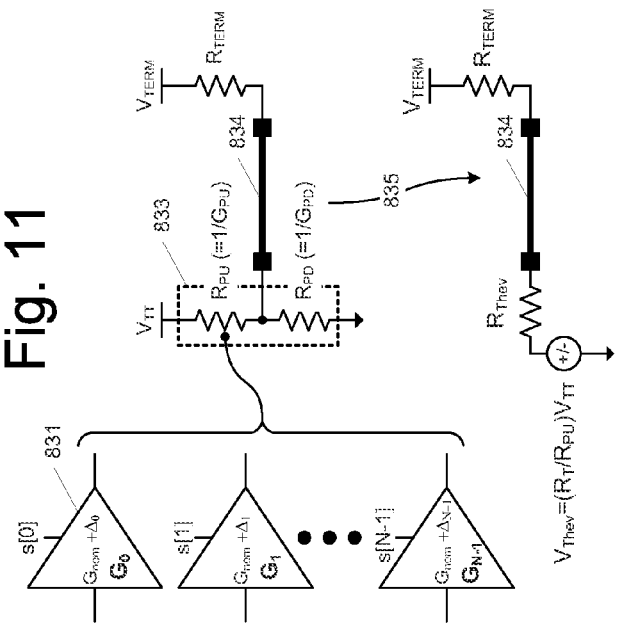
Fig. 11
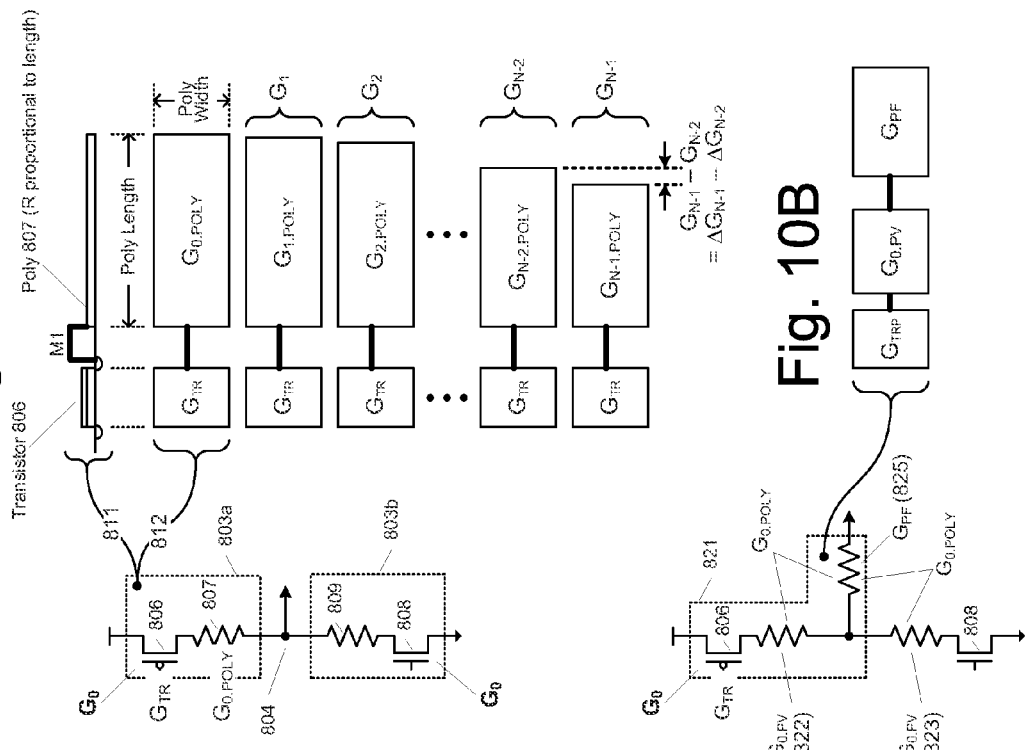
Fig. 10A
Fig. 10B

HIGH RESOLUTION OUTPUT DRIVER

CROSS REFERENCE TO RELATED APPLICATIONS

Pursuant to 35 U.S.C. §§365 and 371, this application is a United States National Stage Application that claims priority to International Application No. PCT/US2010/048826 filed Sep. 14, 2010, which claims priority to U.S. Provisional Patent Application No. 61/242,319 filed Sep. 14, 2009. Each of the above-identified patent applications is hereby incorporated by reference in its entirety.

TECHNICAL FIELD

The present invention relates generally to the field of electronic communications and more particularly to output drivers for signaling between integrated circuit devices.

BACKGROUND

FIG. 1 illustrates a conventional push-pull output driver 100 used to output an information-bearing signal from one integrated circuit (IC) device to another via a chip-to-chip signaling link. The output driver is designed to meet a specified output impedance, equalization range and impedance-calibration range, with 4-bit resolution in both the equalization and impedance calibration. Internally, the output driver includes two parallel driver elements: one driver element 101 dedicated to transmitting a data bit of interest ($d_n$) and another "equalizing" driver element 103 for contributing a post-tap equalization signal (i.e., sourced by the next data bit to be transmitted, $d_{n+1}$) of variable strength in accordance with an equalizer control value ("eq"). Referring to detail view 105, the equalizing driver element is implemented as a four-bit DAC (digital-to-analog converter) having four driver components 109 that contribute pull-up or pull-down currents equal to $\alpha/2$, $\alpha/4$, $\alpha/8$ and $\alpha/16$, respectively, where $\alpha$ is the maximum post-tap equalization current contribution (e.g., maximum amount of output signaling current sourced or sunk by post-tap-allocated sub-drivers). As shown, individual bits of the equalizer control value are supplied to respective multiplexers 107 to select either the post-tap or main-tap as the data source for the corresponding DAC driver component, and thus enable the post-tap equalization contribution to range from approximately $\alpha$ (i.e., post-tap applied to all DAC driver components) to zero (main-tap applied to all DAC driver components) in increments of $\alpha/16$.

While the pull-up and pull-down loads that form equalization driver components 109 are nominally sized to meet the specified output impedance, $Z_{TERM}$, variations in process, temperature and voltage (referred to collectively herein as "process variation") may yield an actual impedance arbitrarily different from the specified value and thus a noise-producing impedance discontinuity that degrades signaling performance. To avoid this result, the dedicated driver element 101 and each of the equalizer driver components 109 are themselves implemented by impedance calibration DACs 112 that allow adjustment of the actual impedance of a given driver component (and thus the overall driver element) by $\pm\beta$, the maximum and minimum anticipated process variations or "process corners." The consequence of this arrangement is that each of the calibration DAC driver components (113, 115), itself a slice of a given equalizing driver element 109, is further sliced into sub-driver components of the impedance calibration DAC. Consequently, the $\alpha/16$ DAC driver component, which is a fraction, $\alpha/15$, of the overall output driver size, is itself sliced into a number of sub-driver components, the smallest of which constitutes a fraction, $2\beta/15$, of the $\alpha/16$ driver component and therefore $2\beta\alpha/225$. To avoid scaling errors, the smallest sub-driver component is typically replicated in multiple instances (thermometer coded) to implement the larger sub-driver components as shown at $117_0$ (single pull-up transistor and pull-down transistor each having unit conductance $G_u$), $117_1$ (two parallel pull-up transistors to establish net conductance $2G_u$), $117_2$ (four parallel pull-up/pull-down transistors to establish net conductance $4G_u$). Accordingly, the overall driver is divided into $(Q_{EQ}*Q_{CAL})/2\beta\alpha$ slices or branches ($Q_{EQ}$ and $Q_{CAL}$ being the quantization steps required in the equalizer and impedance calibrator, respectively), each having uniform conductance $G_u$ (or resistance $1/G_u$), with respective quantities of those branches (i.e., 1, 2, 4, 8, 16, 32, etc.) being operated as an indivisible unit to quantize the impedance calibration and equalization ranges according to the specified resolution.

Although acceptable in some signaling applications, the foregoing driver arrangement presents a number of implementation challenges as process geometries shrink. First, the net transistor width (i.e., $W_{PHYS}$ corresponding to the desired termination impedance, $Z_{TERM}$) may be insufficient to permit subdivision into the requisite number of branches without violating process minimums. And while the transistor length may be expanded to overcome this limitation, such an expansion exponentially increases the overall driver size of the driver, thus incurring a substantial die-area and power-consumption penalty. Similarly, the large number of driver branches demands an extensive and power-hungry pre-driver; an area and power penalty multiplied by the many parallel output drivers 100 typically included in an IC signaling interface.

BRIEF DESCRIPTION OF THE DRAWINGS

The present invention is illustrated by way of example, and not by way of limitation, in the figures of the accompanying drawings and in which like reference numerals refer to similar elements and in which:

FIG. 2A illustrates a hierarchical output driver implemented using differential equalizer elements to reduce the requisite number of driver branches by more than half relative to an implementation with uniform equalizer elements;

FIG. 2B presents a conceptual view of the differential element approach applied in FIG. 2A;

FIG. 2C contrasts the subdivision of the net transistor width in the differential equalizer-element driver with the subdivision that results using a uniform element approach;

FIG. 3A illustrates a hierarchical output driver implemented using differential impedance calibration elements, again reducing the requisite number of driver branches by more than half relative to an implementation having uniform equalizer elements;

FIG. 3B presents a conceptual view of the stepwise calibration achieved using the differential-element approach of FIG. 3A;

FIG. 3C contrasts the subdivision of the net transistor width in the differential-calibration-element driver with the subdivision that results using a uniform element approach;

FIG. 4A illustrates yet another hierarchical output driver embodiment, in this case having a differential-element impedance calibration sub-driver nested within a differential-element equalizer to reduce the requisite number of driver branches by approximately 80% relative to an implementation based on uniform equalizer elements;

FIG. 4B contrasts the subdivision of the net transistor width in the nested differential-element DAC output driver with the subdivision that results using a uniform element approach shown in FIG. 4A;

FIGS. 5A and 5B illustrate alternate techniques for spanning a range of interest using non-uniform conductances;

FIG. 6A illustrates an alternative embodiment of an output driver in which impedance calibration and equalization are implemented in respective, parallel portions at the overall output driver and thus bilaterally in side-by-side, DACs rather than hierarchically in nested DACs;

FIG. 6B illustrates a physical arrangement of driver branches that may be used to implement the equalizer and impedance calibrator in a bilateral output driver embodiment;

FIG. 7A illustrates a target-driven equalizer calibration engine together with an impedance calibration engine;

FIG. 7B illustrates an impedance calibration operation effected by the impedance calibration engine of FIG. 7A;

FIG. 7C illustrates an equalizer calibration effected by the target-driven equalizer calibration engine of FIG. 7A;

FIG. 9A illustrates an exemplary scaling engine or scaling logic circuit that looks up the scaled equalizer step size based upon a value determined by an equalizer calibration engine or impedance calibration engine;

FIG. 9B illustrates an alternative equalizer scaling embodiment in which impedance calibration settings (e.g., cal_pu and/or cal_pd) are supplied to the equalizer scaling logic and applied therein to estimate (or determine) the desired top-of-scale setting for the equalizer;

FIG. 10A illustrates an exemplary implementation of a differential-element driver branch;

FIG. 10B illustrates an alternative implementation of a differential-element driver branch;

FIG. 11 illustrates an exemplary approach to determining $G_0$-$G_{N-1}$ for a given differential-element DAC, for example, to be used within an equalization sub-driver or impedance calibration sub-driver;

DETAILED DESCRIPTION

Figure 1:
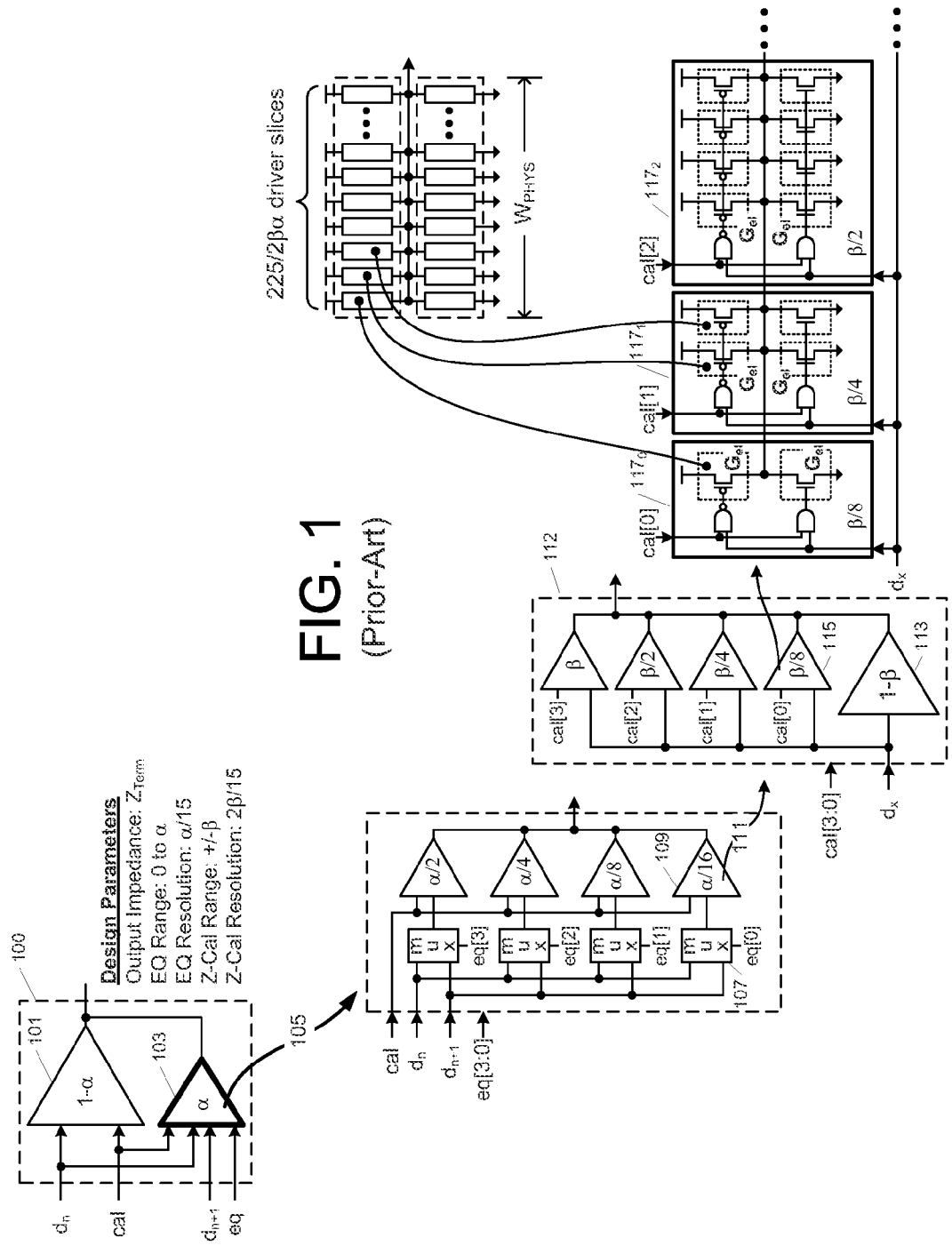
FIG. 1 illustrates a conventional output driver.

A high-resolution output driver implemented by a relatively small number of sub-driver branches or slices is disclosed in various embodiments. In several embodiments, the number of sub-driver slices (also referred to herein as driver slices or driver branches) is reduced without sacrificing range-critical resolution through the use of non-uniform sub-driver load elements having nominal impedances substantially larger than a quantization step and that incrementally differ from one another by an impedance step substantially smaller than a quantization step. In one such embodiment, such "differential-element" or "non-uniform-element" sub-driver slices implement respective elements of an n-choose-k equalizer, with each such differential-element sub-driver slice being implemented by a uniform-element impedance calibration DAC. In another embodiment, each component of a uniform-element equalizer is implemented by a differential-element impedance calibration DAC, and in yet another embodiment, each component of a differential-element equalizer is implemented by a differential-element impedance calibration DAC, with all such "hierarchical" embodiments having a reduced number of driver slices relative to the output driver of FIG. 1.

In an additional set of embodiments, equalization and impedance calibration functions are implemented bilaterally in respective parallel sets of driver branches, rather than in the nested "DAC within a DAC" arrangement of the hierarchical embodiments. Through such bilateral arrangement, multiplication of the equalizer and calibrator quantizations (i.e., range divided by resolution) is avoided, dramatically lowering the total number of sub-driver slices required to meet the specified ranges and resolutions. Moreover, the equalization range and resolution may be implemented by differential slices or uniform slices, and the calibrator range and resolution may likewise be implemented by differential slices or uniform slices so that multiple bilateral embodiments are possible. Further, various calibration techniques and circuitry are disclosed in connection with bilateral embodiments, including dual-loop calibrations that independently calibrate the impedance and equalization portions of the output driver, and scaled calibration techniques that automatically adjust equalizer control values in accordance with the process variation determined during impedance calibration. These and other embodiments are described in further detail below.

FIG. 2A illustrates a hierarchical output driver 200 implemented using differential equalizer elements to reduce the requisite number of driver branches by more than half relative to an implementation with uniform equalizer elements. As shown, output driver 200 includes a dedicated driver component 201 and equalizer driver component 203, each coupled to receive a data bit, $d_n$ (i.e., the "main tap"; the source of data to be conveyed in a given transmit interval), and a impedance control value ("cal"). The equalizer driver component 203 is additionally coupled to a single post-tap in the example shown (i.e., to receive a data bit, $d_{n+1}$, to be conveyed in the immediately subsequent transmit interval) and to receive an equalizer control value, "eq." While the single post-tap example is carried forward in various embodiments below, in all such embodiments, the equalizer driver component may be additionally or alternatively coupled to one or more different post-taps (e.g., supplying post-tap data $d_{n+2}$, $d_{n+3}$, etc.) and/or to one or more pre-taps (e.g., supplying pre-tap data $d_{n-1}$, $d_{n-2}$, etc.), with the equalizer control value including control vectors as necessary to specify the number of equalizer driver branches to be allocated to a given data tap.

As shown in detail view 205, the equalizer driver component 203 may be implemented by a set of differential-element sub-drivers 206 ($G_0$-$G_5$, and thus six in the example shown, though more or fewer driver elements may be provided), each having a nominal conductance (or admittance) $G_{NOM}$, but perturbed therefrom by a different offset value, $\Delta_i$, where the change in the offset value between consecutive driver elements 'i' and 'i–1' (i.e., $\Delta_i$–$\Delta_{i-1}$) is generally less than or approximately equal to the desired equalization resolution (i.e., the desired "equalization step"). Moreover, the incoming equalization control value (i.e., a four-bit value "eq[3:0]" in this example, though equalizer control values having a number of bits, M, greater or less than four may alternatively be used), is supplied to a decoder 209 that expands the incoming control value into a selection code, s[5:0], having a constituent bit to select the data source (post-tap or main) for each differential-element sub-driver 206. By this arrangement, and by establishing the differential offset values ($\Delta_i$) such that different combinations of differential-element sub-drivers 206 yield non-redundant equalization values, the 63 different combinations (i.e., $2^N-1$ combinations, where N is the number of differential-element sub-drivers) of differential-element sub-drivers may yield an ascending equalization profile (e.g., ascending level of output signaling current sunk or sourced in response to the state of the post-tap data) that can be used to approximate the incremental equalization steps otherwise achieved by dividing the equalizer into $2^M-1$ uniform sub-driver elements (i.e., 15 uniform sub-driver elements controlled in sets of 1, 2, 4 and 8). That is, in the particular example shown, selection codes corresponding to 15 of the 63 possible differential-element sub-driver combinations determined to best approximate the desired quantization of the equalizer range may be stored within the decoder 209, thereby forming a lookup table in which a given equalizer control value, eq[3:0], indexes to (or "looks up") a best-match selection code. Respective bits of the indexed selection code are applied to multiplexers 207 to switchably couple each differential-element sub-driver to the main or post-tap, as the case may be, and thereby establish the desired equalizer setting.

FIG. 2B presents a conceptual view of the differential-element sub-driver approach. In effect, the goal is to construct a stepwise progression through the equalization range (i.e., quantize the range) using conductances substantially larger than the conductance corresponding to the equalization step itself. Thus, instead of allocating an incremental number of uniform conductances to the post-tap (or main, depending upon the progression direction), differences between nominally-equally sized conductance elements each substantially larger than the incremental conductance step (i.e., each at least twice the incremental conductance step in the example shown) are used to establish the stepwise progression and thereby quantize the equalization range. Observations regarding the differential-element quantization include but are not limited to the following (nor are any of the following necessarily required in a given implementation):

- the conductance (and therefore the size) of the smallest differential-element sub-driver 206, $G_{due}$, is approximately twice the unit conductance, $G_{uue}$, in a uniform-element sub-driver implementation
- the differential conductance between any two nearest-size differential-element sub-drivers (i.e., $G_i-G_{i-1}$) is less than or equal to the conductance corresponding to the desired equalization step
- exclusive combinations of differential-element sub-drivers, each having the same number of differential-element sub-drivers, may be used to implement incremental conductance values from one step to the next within the equalization range (e.g., as shown in FIG. 2B, differential-element sub-drivers 0 and 1 are selected or ganged to effect the conductance corresponding to a given equalization step, and differential-element sub-drivers 2 and 4 are selected to effect the conductance of the next higher step)
- the number of selection signals (i.e., multiplexer control signals) in a given state progresses monotonically to effect the progression through the equalization range (i.e., assuming that a differential-element sub-driver is allocated to the equalizer stack in response to assertion of the corresponding select signal, then the number of asserted select signals for each of the thirteen equalizer steps shown is: 1, 1, 2, 2, 2, 3, 3, 4, 4, 4, 5, 5, 6; by contrast the number of asserted bits within the equalizer control value progresses non-monotonically: 1, 1, 2, 1, 2, 2, 3, 1, 2, 2, 3, 2, 3, 3, 4)
- the freedom to select any subset k of the N differential-element sub-drivers effects an N-choose-k function that provides the highest resolution (i.e., greatest number of combinations) when k is approximately midway between 1 and N (i.e., k=N/2) and thus at the center of the quantization range where resolution tends to be most critical
- in some implementations, including that shown in FIG. 2B, resolution at the extreme ends of the quantization range may be sacrificed
- in some implementations, including that shown in FIG. 2B, the sum of the conductances of the differential-element sub-drivers matches or corresponds to the quantization range (i.e., $N*G_{NOM}$ is equal to or approximately equal to $G_{RANGE}$, the net conductance corresponding to the quantization range)
- incremental equalization adjustments (i.e., equalizer quantization) are achieved by allocating successive sets of differential-element sub-drivers (i.e., from main to post-tap data) in which each sub-driver contributes a conductance substantially larger than the conductance corresponding to the desired equalization step size, and in which the conductance differential between any two successively selected sets of differential-element sub-drivers approximately matches the desired equalization step size (in contrast, to incremental equalization achieved by incrementing the number of uniformly-sized elements allocated to post-tap data)

Referring again to FIG. 2A, each of the differential-element sub-drivers 206 within the equalizing driver component 203 is implemented by a respective uniform-element impedance calibration DAC as shown in detail view 220. That is, each differential-element sub-driver 206 is implemented by a respective impedance calibration DAC itself having sub-drivers formed by respective quantities of uniform-element driver slices. In one embodiment, each impedance calibration DAC (which receives either $d_n$ or $d_{n+1}$ (depicted as $d_x$) includes a base calibration sub-driver 221 to contribute a conductance $(1-\beta)*G_i$ ($G_i$ being the intended conductance of the $i^{th}$ differential-element equalizing sub-driver 206) in parallel with selectively enabled calibration sub-drivers 223. As shown in detail view 240, each of the calibration sub-drivers ($241_0$ and $241_1$) includes logic (e.g., gates 245 and 247) to enable or disable $2^j$ uniform load elements 249, 251 (where j= 0, 1, 2, . . . ) from sourcing or sinking (i.e., "contributing") an output current via output node 252 in accordance with the state of the data tap, $d_x$. Note that, explicit instances of 1, 2, 4, etc. load elements 249, 251 having unitary pull-down or pull-up conductance ($G_{d-el}$) may be coupled in parallel within a given calibration subdriver 241 to implement the desired impedance therein, or singular load elements may be provided in each calibration subdriver, with the load elements within driver $241_j$ having a conductance of $2^j*G_{d-el}$ (i.e., j=0, 1, 2, . . . ). Accordingly, output driver 200 has a hierarchical architecture (or "nested DAC" architecture) as the constituent DAC drivers of the equalizing driver component 203 are themselves implemented by respective impedance calibration DACs as shown at 220. Though not specifically shown, the dedicated driver component 201 may likewise be implemented by an impedance calibration DAC, with all such impedance calibration DACs being designed to span (quantize) a range from $G_{DC}(1-\beta)$ to $G_{DC}(1+\beta)$, where $G_{DC}$ is the nominal net conductance of a given driver component.

FIG. 2C contrasts the subdivision of the net transistor width (i.e., $W_{PHYS}=(1+\beta)W_{TERM}$) in the differential-element equalizer shown at 205 of FIG. 2A with the subdivision that results using a uniform-element approach. As shown, only 90 driver branches (6 differential-element equalizer DAC sub-drivers, each subdivided into a respective set of 15 impedance calibration branches) are required to span the equalizer range, as compared with 225 driver branches (15 uniform equalizer DAC components, each subdivided into a respective set of 15 impedance calibration branches), thus effecting a 60% reduction in the number of driver branches. More specifically, under the uniform-element approach, the equalizer range corresponds to a portion, $\alpha W_{PHYS}$, of the net transistor width and is thus quantized by 15 uniform-element equalizer sub-drivers (i.e., $Q_{EQ}=15$) into widths of $(\alpha/15)W_{PHYS}$. Because each of those widths is further quantized by 15 uniform impedance calibration elements (i.e., $Q_{CAL}=15$ in a 4-bit resolution impedance calibration implementation) across a range of 213 (i.e., $\pm\beta$), the smallest transistor width required, $W_{u\text{-}el}$, is $(2\beta\alpha/225)W_{PHYS}$. Although some headroom may be gained by halving the equalizer quantization (e.g., to enable equalization across a range from 0 to 33% ($\alpha$=0.33) with a resolution of approximately 5% of full-scale), the requisite transistor slice is still roughly $(1/525)W_{PHYS}$ (assuming a tolerable process variation of $\pm30\%$). Assuming that the net transistor width corresponding to a specified 40-ohm output impedance in an exemplary 40 nm (40-nanometer) fabrication process is ~13.6 microns (13.6 μm), the elemental transistor width required would be approximately 26 nanometers and thus below the minimum permissible feature size (i.e., 40 nm). By contrast, the smallest transistor width required under the differential-element approach, $W_{d\text{-}el}$, is approximately twice $W_{u\text{-}el}$, and thus obtains the critical headroom needed for implementation in the exemplary 40 nm fabrication process. Note that the above specifications and dimensions, though carried forward in a number of embodiments described below, are provided for purpose of example only and may vary in alternative embodiments.

FIG. 3A illustrates a hierarchical output driver 280 having impedance calibration circuitry implemented with differential-element sub-drivers to reduce the requisite number of output driver branches by more than half relative to a uniform-element implementation. As in the embodiment of FIG. 2A, the output driver includes a dedicated driver component 281 and equalizer driver component 283, each coupled to receive main-tap data, $d_n$, and an impedance control value ("cal"). The equalizer driver component is additionally coupled to a single post-tap data source in the example shown (i.e., to receive a data bit, $d_{n+1}$, to be conveyed in the immediately subsequent transmit interval) and to receive an equalizer control value.

As shown in detail view 285, the equalizer driver component includes a set of binary-weighted DAC drivers each having a binary-weighted number (1, 2, 4 or 8 in this example) of uniform sub-driver load elements (which may include binary-scaled weighting of the load elements). By this arrangement, constituent bits of a binary control word may be applied directly to respective multiplexing elements 287 to enable selective (switched) coupling of either the main or post-tap data source to the input of the corresponding uniform-element sub-driver 289. Accordingly, the specified equalization range is quantized into fifteen incremental equalization steps, with each quantization step allocating an additional one of the uniform load elements within sub-drivers 289 to the post-tap data source (or to the main data source depending upon the progression direction).

Referring to detail view 291, each of the uniform-element sub-drivers within the equalizer driver component 283 is itself implemented using differential-element impedance calibration sub-drivers. That is, instead of employing 15 uniform calibration driver loads (including implementations that include binary weighted loads) to achieve 4-bit impedance-calibration resolution, an exemplary set of N=6 differential-element sub-drivers are provided. Each of the N differential-element sub-drivers $G_i$ has a nominal conductance (or admittance) $G_{NOM}$ but is perturbed from the nominal value by a respective offset value, $\Delta_i$, (i.e., $G_i=G_{NOM}+\Delta_i$) where the change in the offset value between consecutive differential-element sub-drivers $G_i$ and $G_{i-1}$ (i.e., $\Delta_i-\Delta_{i-1}$) is generally less than or approximately equal to the desired impedance resolution (i.e., the desired incremental impedance calibration step). Moreover, the incoming impedance control value (i.e., a four-bit value "cal[3:0]" in this example, though control values having a number of bits, M, greater or less than four may alternatively be used), is supplied to a decoder 293 that expands the incoming control value into an enable value, e[5:0], having a constituent bit to control (i.e., enable or disable) each differential-element sub-driver. By this arrangement, and by establishing the differential offset values ($\Delta_i$) such that different combinations of differential-element sub-drivers yield non-redundant calibration values, the 63 different combinations of differential-element sub-drivers may yield an ascending impedance calibration profile that can be used to approximate the incremental calibration steps otherwise achieved by dividing the calibrator into $2^M-1$ uniform driver elements (i.e., 15 uniform driver elements grouped in sets of 1, 2, 4 and 8). That is, in the particular example shown, enable values corresponding to 15 of the 63 possible differential driver combinations determined to best approximate the desired quantization of the calibration range (i.e., $2\beta G_{PHYS}$, where $G_{PHYS}$ is the net conductance corresponding to net transistor width, $W_{PHYS}$, and $\beta$ is the maximum process variation to be compensated) may be stored within the decoder 293, thereby forming a look-up table in which a given impedance control value indexes to (or "looks up") a best-match enable value. As shown in detail view 300, each bit of the indexed enable value is applied to logic gates 303 and 305 or other switching circuitry within a respective one of the differential-element sub-drivers $297_0$-$297_5$ to switchably enable or disable a signaling contribution from that differential-element sub-driver. As shown (and as discussed in greater detail below), each of the individual differential-element sub-drivers includes pull-up and pull-down load elements 307, 308 that may be implemented by one or more identical switching transistors (i.e., identical PMOS transistors 312 and identical NMOS transistors 314) with the differential offsets being achieved through length modulation of polysilicon resistive elements 316.

FIG. 3B presents a conceptual view of the stepwise impedance-calibration achieved using the differential-element sub-driver approach. As shown, the selection of specific, pre-determined combinations of differential-element sub-drivers achieves a stepwise progression through the impedance calibration range (i.e., quantizes the range) using elements having conductances substantially larger than the conductance corresponding to the impedance calibration step ("Z-Cal Step") itself. Thus, instead of allocating an incremental number of uniform-element conductances, $G_{u\text{-}el}$, to the post-tap (or main, depending upon the progression direction), differences between nominally-equally sized differential-elements each having a conductance substantially larger than the incremental conductance step (i.e., each at least twice the incremental conductance step in the example shown) are used to establish the stepwise progression. Observations regarding the differential-element quantization include but are not limited to the following (nor are any of the following necessarily required in a given implementation):

- the conductance (and therefore the size) of the smallest required load element, $G_0$, is approximately twice the size of the smallest required load element, $G_{u\text{-}el}$, in a uniform element implementation
- the differential conductance between any two nearest-size differential-element sub-drivers (i.e., $G_i - G_{i-1}$) is less than or equal to the conductance of an impedance calibration step
- exclusive combinations of differential-element sub-drivers, each having the same number of differential-element sub-drivers, may be used to implement incremental conductance values from one step to the next within the impedance calibration range (e.g., as shown in FIG. 3B, differential-element sub-drivers 0 and 1 are enabled and all others disabled to effect the conductance corresponding to a given impedance calibration step, and differential-element sub-drivers 2 and 4 are enabled and all others disabled to effect the conductance of the next higher step)
- the number of enable signals (i.e., multiplexer control signals) in a given state progresses monotonically to effect the progression through the impedance calibration range (i.e., assuming that a differential element is enabled to contribute a signal to the output node of the output driver in response to assertion of the corresponding enable signal, then the number of asserted enable signals for each of the thirteen impedance calibration steps shown is: 1, 1, 2, 2, 2, 3, 3, 4, 4, 4, 5, 5, 6; by contrast the number of asserted bits within the impedance control value progresses non-monotonically: 1, 1, 2, 1, 2, 2, 3, 1, 2, 2, 3, 2, 3, 3, 4)
- the freedom to select any subset k of the N differential-element sub-drivers effects an N-choose-k function that provides the highest resolution (i.e., greatest number of combinations) when k is approximately midway between 1 and N (i.e., k=N/2) and thus at the center of the quantization range where process variations are most statistically likely to fall
- in some implementations, including that shown at FIG. 3B, resolution at the extreme ends of the quantization range may be sacrificed
- in some implementations, including that shown in FIG. 3B, the sum of the conductances of the differential-element sub-drivers matches the quantization range (i.e., $N*G_{NOM}$ is equal to or approximately equal to $G_{RANGE}$, the net conductance corresponding to the quantization range)
- incremental impedance-calibration steps are achieved by enabling successive sets of differential-element sub-drivers (i.e., switching off a given set of differential-element sub-drivers and switching on a subsequent set of differential-element sub-drivers) in which each differential-element sub-driver has a conductance substantially larger than the conductance corresponding to the desired calibration step size, and in which the conductance differential between any two successively selected sets of differential-element sub-drivers approximately matches the desired impedance calibration step size (in contrast to the incremental impedance calibration achieved by incrementing the enabled number of uniform-element sub-drivers)

FIG. 3C contrasts the subdivision of the net transistor width (i.e., $W_{PHYS}=(1+\beta)W_{TERM}$) in the differential-element impedance calibration circuit with the subdivision that results using a uniform-element approach. Again, only 90 driver branches (15 uniform equalizer DAC components, each subdivided into a respective set of 6 differential-element calibration branches) are required to span the equalizer range, as compared with 225 driver branches in the uniform-element calibration approach (15 uniform equalizer DAC components, each subdivided into a respective set of 15 uniform-element calibration sub-drivers), thus effecting a 60% reduction in the number of driver branches required to span the equalization range and calibration range. As in the embodiment of FIGS. 2A-2C, the smallest transistor width required under the differential-element calibration approach, $W_0$, is approximately twice the smallest width required if uniform-element calibration sub-drivers are applied (i.e., $W_0 \approx 2W_{u\text{-}el}$), and thus may yield the headroom needed for implementation in modern processes.

FIG. 4A illustrates another embodiment of a hierarchical output driver embodiment, in this case having a number of differential-element impedance calibrators 360 nested within respective differential-element sub-drivers 353 of an equalizing driver component 343 to reduce the requisite number of driver branches by approximately 80% relative to an implementation based on uniform equalizer elements. As in the embodiments of FIGS. 2A and 3A, the nested differential-element output driver 341 includes a dedicated driver component 341 and equalizer driver component 343, each coupled to a main tap (to receive data bit, $d_n$) and coupled to receive a impedance control value ("cal"). The equalizer driver component 343 is additionally coupled to a single post-tap in the example shown (i.e., to receive a data bit, $d_{n+1}$, to be conveyed in the immediately subsequent transmit interval) and to receive an equalizer control value, "eq."

As shown in detail view 344, the equalizer driver component is implemented by an exemplary set of six differential-element sub-drivers, each having a nominal conductance (or admittance) $G_{NOM}$, but perturbed therefrom by a different offset value, $\Delta_i$, where the change in the offset value between consecutive driver elements $G_i$ and $G_{i-1}$ (i.e., $\Delta_i - \Delta_{i-1}$) is generally less than or approximately equal to the desired equalization resolution (i.e., the desired incremental equalization step). As in the embodiment of FIG. 2A, the incoming equalization control value (i.e., a four-bit value "eq[3:0]" in this example, though equalizer control values having a number of bits, M, greater or less than four may alternatively be used), is supplied to a decoder 351 that expands the incoming control value into a selection code, s[5:0], having a constituent bit to select the data source (post-tap or main) for each differential-element sub-driver 353. By this arrangement, and by establishing the differential offset values ($\Delta_i$) such that different combinations of differential-element sub-drivers yield non-redundant equalization values, the 63 different combinations (i.e., $2^N - 1$ combinations, where N is the number of differential-element sub-drivers) of differential-element sub-drivers may yield an ascending equalization profile that can be used to approximate the incremental equalization steps otherwise achieved by dividing the equalizer into $2^M - 1$ uniform driver elements (i.e., 15 uniform driver elements grouped in sets of 1, 2, 4 and 8). That is, in the particular example shown, selection codes corresponding to 15 of the 63 possible differential driver combinations determined to best approximate the desired quantization of the equalizer range may be stored within the decoder 351 so that application of a given equalizer control value indexes to (or "looks up") a best-match selection code. Respective bits of the indexed selection code are applied to multiplexers 352 as shown to switchably couple each differential-element sub-driver to the main or post-tap data source, as the case may be, and thereby effect the desired equalizer setting.

Referring to detail view 359, each of the differential-element sub-drivers 353 within the equalizer driver component 343 is itself implemented using differential-element impedance calibration sub-drivers, thus effecting a nested pair of differential-element DACs (i.e., differential-element DAC within a differential-element DAC). Each of the N differential-element sub-drivers 'i' has a nominal admittance (or conductance) $G_{NOM}$ but is perturbed from the nominal value by a respective offset value, $\Delta_i$, where the change in the offset value between consecutive sub-driver elements $G_i$ and $G_{i-1}$ (i.e., $\Delta_i - \Delta_{i-1}$) is generally less than or approximately equal to the desired equalization resolution (i.e., the desired incremental equalization step). Moreover, the incoming impedance control value (i.e., a four-bit value "cal[3:0]" in this example, though control values having a number of bits, M, greater or less than four may alternatively be used), is supplied to a decoder 369 that expands the incoming control value into an enable code, e[5:0], having a constituent bit to control (i.e., enable or disable) each differential-element sub-driver. By this arrangement, and by establishing the differential offset values ($\Delta_i$) such that different combinations of differential-element sub-drivers yield non-redundant equalization values, the 63 different combinations of differential-element sub-drivers may yield an ascending impedance calibration profile that can be used to approximate the incremental calibration steps otherwise achieved by dividing the calibrator into $2^M-1$ uniform driver elements (i.e., 15 uniform driver elements grouped in sets of 1, 2, 4 and 8). That is, in the particular example shown, enable codes corresponding to of the 63 possible differential driver combinations determined to best approximate the desired quantization of the calibration range (i.e., $2\beta G_{PHYS}$, where $G_{PHYS}$ is the net conductance corresponding to net transistor width, $W_{PHYS}$, and $\beta$ is the maximum process variation to be compensated) may be stored within decoder 369 so that application of a given impedance control value indexes to (or "looks up") a best-match enable code. As explained above in reference to FIG. 3A, each bit of the indexed enable code may be applied to logic or switching circuitry within a respective one of the differential-element sub-drivers 365 to switchably enable or disable a signaling contribution from that differential-element sub-driver (base sub-driver 363 is engaged during a transmission interval regardless of the calibration control value). As discussed in greater detail below, each of the individual sub-driver elements may be implemented by one or more identical switching transistors with the differential conductance offsets, $\Delta_i$, being achieved through length modulation of polysilicon resistive elements.

FIG. 4B contrasts the subdivision of the net transistor width (i.e., $W_{PHYS}=(1+\beta)W_{TERM}$) in the nested differential-element output driver shown in FIG. 4A with the subdivision that results using a uniform element approach. In the nested differential-element implementation, only 36 driver branches (6 differential-element equalizer DAC sub-drivers, each subdivided into a respective set of 6 differential-element impedance-calibration sub-drivers) are required to span the equalizer range and provide impedance calibration, as compared with 225 driver branches in the uniform element approach (15 uniform-element equalizer DAC components, each subdivided into a respective set of 15 uniform-element calibration branches), thus reducing the number of driver branches required by nearly 85%. Further, because the minimum-conductance differential-element equalizer sub-driver (i.e., 353, $G_{E0}$) has approximately twice the width (i.e., twice the conductance) of the counterpart component in a uniform-element equalizer, and the minimum differential-element calibrator sub-driver (i.e., 365 $G_0$) also has approximately twice the width of uniform calibrator elements that could otherwise be used (i.e., as in the embodiment of FIG. 2A), the minimum component width required to span the equalizer range with impedance calibration of each equalizer sub-driver 353 is approximately four-times smaller (i.e., one-fourth the width) than the minimum component width required in a nested uniform-element equalizer, uniform-element calibrator implementation. That is, as shown in FIG. 4B, in a nested uniform-element approach having four-bit resolution within the equalizer and four-bit resolution within the impedance calibrator, the equalization range $\alpha W_{PHYS}$ is sliced into 15 equalization steps by the uniform-element equalizer, with a $2\beta$ range within each equalization step being sliced into 15 components by the uniform-element calibrator, and thus establishing a minimum feature width, $G_{u-el}=2\beta\alpha W_{PHYS}/225$. By contrast, using nested differential-element equalizer and calibrator DACs, the minimum feature width, $W_0$, is approximately $4W_{u-el}$ and thus $G_0$ is approximately $4G_{u-el}$. As a result, the equalizer and calibrator ranges may be spanned with the desired resolution (or approximately so) without necessitating transistor widths that violate process minimums and indeed, provide headroom for higher resolution implementation of the equalizer, impedance calibrator or both.

Reflecting on the quantization profiles shown in FIGS. 2B and 3B, it is evident that the conductance of the smallest differential-element available to quantize the equalization or calibration range shown is larger than the initial step and the final step. In some embodiments, this loss of resolution at the extreme ends of the range of interest is completely tolerable (and indeed the higher resolution achievable at the center of the quantized range is a preferred trade-off). In other cases, the inability to reach a step in the range of interest may be less desirable.

FIGS. 5A and 5B illustrate alternate techniques for more completely quantizing a range of interest using non-uniform or differential-element conductances. That is, because the smallest differential-element conductance available to quantize the ranges shown in FIGS. 2B and 3B (i.e., $G_0$) is larger than the initial step and final step required span the range of interest at a given resolution, the range of interest is not be fully quantized as shown by the missing first and last quantization steps. By contrast, as shown in FIG. 5A, if the starting, fixed conductance, $G_{FIX}$, is reduced to $G'_{FIX}$ such that the actual range spanned by the differential (non-uniform) elements exceeds the range of interest by $G_0$ (i.e., $G'_{RANGE}>G_{RANGE}$) it becomes possible to more completely quantize the range of interest without increasing the net transistor width (i.e., providing a quantization step at the bottom of range as shown. That is, even though $N*G'_{NOM}$ exceeds $N*G_{NOM}$ by $G_0$, $G'_{Fix}$ is $G_0$ less than $G_{FIX}$, thus establishing an equal overall conductance. Also, while the range spanned by the N differential elements is stretched, any loss of resolution may be compensated by increasing the number of differential-element sub-drivers (N) used to span the range.

In FIG. 5B, the range of interest is even more fully quantized, in this case by increasing the spanned range by $G_0$ at both end of the range of interest. By this arrangement, equalization or impedance calibration steps at points 384 and 385 are provided. Also, even though the net transistor size is now expanded by $2G_0$ beyond that otherwise needed to span the range of interest, the additional width tends to be negligible in relation to the overall transistor width required to achieve $R_{term}$ (representing a very small percentage thereof), and certainly not the exponential increase in area that results when the transistor length is expanded to achieve a required width/length ratio without violating process minimums. Further, any loss of resolution due to the expanded range may be counteracted by increasing the number of differential-element sub-drivers used to span the range.

FIG. 6A illustrates an alternative embodiment of an output driver 450 in which impedance calibration and equalization are implemented in respective, parallel portions of the overall output driver and thus bilaterally in side-by-side, DACs rather than hierarchically in nested DACs. Thus, as shown in detail view 451, the overall set of driver branches are split into at least two portions, Z-CAL and EQ, with any remaining branches needed to meet a specified termination impedance, $Z_{TERM}$, being disposed in "fixed" branches (i.e., always engaged when the driver is enabled to transmit data, and always dedicated to main data, $d_n$).

As shown in detail views 461 and 463, the equalizer DAC may be implemented using either uniform-element sub-drivers (detail view 461) or by differential-element sub-drivers (detail view 463). In the uniform-element implementation, the equalizer DAC includes $2^N-1$ uniform driver branches (i.e., each including a respective pull-up element and a respective pull-down element, with the all pull-up load elements being substantially uniform and all pull-down load elements being substantially uniform, though the pull-up in each branch may be different from the counterpart pull-down element in that branch to account for different PMOS/NMOS characteristics) with groups of 1, 2, 4 or 8 load elements (in this example) being operated as a unit, sourced by either main or post-tap data to effect stepwise equalization adjustments (or increments) in response to an incremental progression of equalizer control value, EQ[3:0]. As discussed, the groups of load elements that form the binary-weighted sub-drivers ($\alpha/16$, $\alpha/8$, $\alpha/4$, $\alpha/2$) may alternatively be implemented as single elements having widths that are a multiple (2×, 4×, 8×) the width of the pull-up/pull-down elements within the smallest sub-driver ($\alpha/16$).

In the differential-element implementation shown at detail view 463, the incoming equalizer control value (eq[3:0]) is supplied to a decoder 481 (e.g., a look-up table) which in turn outputs a selection signal, s[5:0](a 6-bit value in this six-element example), that selects a given N-choose-k combination of differential-element sub-drivers, $G_0$-$G_{N-1}$, where N=6 in this example. As discussed above, each of the N differential-element sub-drivers includes a pull-down load element and pull-up load element nominally sized to meet a nominal conductance $G_{NOM}$ plus a deviation $\Delta_i$ therefrom, where $N*G_{NOM}$ corresponds to the total conductance of the range to be spanned (and possibly an incremental amount beyond the range of interest as discussed in reference to FIGS. 5A and 5B). By establishing $\Delta_i$ such that each of the $2^N-1$ possible combinations of differential elements yields a different net conductance, it becomes possible to approximate the stepwise progression effected by the uniform set of elements shown in detail view 461 using a set of load elements that are each substantially larger than the minimum-size load element required in the uniform element approach. Accordingly, a sequence of stepwise equalization increments (each allocating a greater or lesser equalization contribution to the post-tap data source) may be achieved by selecting respective combinations of differential-element sub-drivers, each combination have a net conductance that differs from the net conductance of the previously selected combination by the desired equalization stepsize (or an approximation thereof).

Still referring to the equalizer DAC and the uniform-element and differential-element implementations thereof, it should be noted that, in contrast to the equalizer DAC implementations shown in FIGS. 2A and 3A, each individual sub-driver (473 or 485) is implemented without an underlying calibration DAC. Thus, the impedance of the individual sub-drivers that form the equalizer DAC, whether implemented by uniform elements or differential elements, may vary depending upon process variations. This impedance variation may cause the equalization step effected by incrementing the equalizer control value to be larger or smaller than the desired stepsize. Further, because the impedance calibrator serves to adjust the impedance of the bilateral output driver as a whole (i.e., does not adjust the impedance of each constituent sub-driver as in the hierarchical approach), the equalization stepsize may remain different from the desired equalization stepsize even after the impedance of the bilateral output driver has been calibrated. As discussed below, scaling errors in the equalization stepsize may be overcome through alternative equalizer calibration techniques. In one embodiment, for example, any scaling error is detected by either a closed-loop equalizer calibration operation or the impedance calibration itself and corrected by application of a counteracting scaling factor. In another embodiment, the scaling error is effectively ignored by providing closed-loop equalization control that servos (i.e., controls via negative feedback) the equalizer control word to a value that minimizes (or at least reduces) an error between the actual equalization output and a target equalization output provided by control circuitry within or external to the integrated circuit containing bilateral output driver 450.

As with the equalizer DAC, the impedance calibration DAC ("Z-Cal") may be implemented by either a uniform-element sub-drivers or differential-element sub-drivers, each as generally described above in reference to FIGS. 3A and 2A, respectively. Noting that the impedance calibration range is intended to enable adjustment of the entire bilateral output driver impedance, it follows that the conductance and thus net width of the overall driver transistor for a given pull-up or pull-down load element should be large enough to accommodate the slowest process corner. Accordingly, the net physical width of the bilateral output driver may be expressed as $W_{PHYS}=W_{TERM}(1+\beta)$, where $W_{TERM}$ is the nominal width of the net transistor corresponding to the target termination impedance, $Z_{TERM}$. Further, because the impedance calibration is intended to span the range from the fastest process corner to the slowest process corner, the impedance calibration range, may be expressed as: $W_{TERM}(1+\beta)-W_{TERM}(1-J\beta)=2\beta W_{TERM}=(2\beta/(1+\beta))W_{PHYS}$, where the factor $2\beta/(1+\beta)$ is referred to in FIG. 6 as $\lambda$ (i.e., $\lambda=2\beta/(1+\beta)$) and represents the fraction of the overall physical transistor width (or net load element width) allocated to the impedance calibration function, and $\beta$ is the maximum anticipated process variation. In one example, b=0.3 (i.e., tolerance of ±30%), so that the overall portion of the physical output driver width allocated to impedance calibration=2*30%/(1+0.3)=54%. In terms of the impedance calibration DAC, the range may be spanned by engaging a specific number (e.g., 0 to 15 in a 4-bit DAC) of uniform load elements, or by engaging various combinations of differential-element loads as described, for example, in reference to FIGS. 2A and 4A.

FIG. 6B illustrates a physical arrangement of driver branches that may be used to implement the equalizer and impedance calibrator in a bilateral output driver embodiment. Although the driver branches are depicted as being uniform in size, this need not be the case (i.e., the branches or constituent load elements thereof may be perturbed (or offset) from nominal to implement differential elements). Also, to the extent that $\alpha W_{PHYS}$ (the portion of the physical width of the collective set of pull-up/pull-down load elements allocated to the equalizer) plus $\lambda W_{PHYS}$ (the portion of the physical width allocated to the impedance calibrator) is less than $W_{PHYS}$ (i.e., $\alpha+\lambda<1$), the remaining portion of the output driver width may be implemented as a "fixed" set of driver branches. That is, a set of driver branches having collective width, $W_{FIX}$, may be provided to supplement the portions of the driver allocated to the impedance calibration and equalization functions, where $W_{FIX}=(1-\alpha-\lambda)W_{PHYS}$. As an example, if $\beta=30\%$ and $\alpha=33\%$, then the remaining 12% of $W_{PHYS}$ (i.e., $[1-0.33-2*(0.3)/(1+0.3)]W_{PHYS}=0.12W_{PHYS}$) is allocated to the main tap on an fixed basis (i.e., neither switched off for impedance calibration purposes, nor switchable between data sources for equalization purposes).

Still referring to FIG. 6B, it can be seen that any of at least four possible configurations may be employed to implement a bilateral output driver: uniform-element impedance calibration combined with uniform-element equalization (referred to herein as a "dual uniform-element DAC embodiment"); uniform-element impedance calibration combined with differential-element equalization (a "hybrid, differential-element equalizer embodiment); differential-element impedance calibration combined with uniform-element equalization (a "hybrid, differential-element impedance-calibrator embodiment); and differential-element equalization combined with differential-element impedance calibration (a "dual differential-element DAC embodiment). Note further that, in the dual uniform-element DAC, the physical width allocated to the bilateral functions (equalization and impedance calibration) need not be the same (and indeed are not the same in the example shown) so that the subdivision into uniform-element sub-drivers to meet respective equalization and calibration range quantizations may yield different size conductance elements within the two portions of the equalizer (i.e., the uniform load elements used to implement the equalizer may not be the same size as the uniform load elements used to implement the impedance calibrator). The same is true in the dual differential-element DAC. The sizes of the differential-element sub-drivers provided to span the equalizer range need not be the same (and indeed are not the same in the example shown) as the sizes of the differential elements provided to span the impedance calibration range. Also, while four-bit resolution is shown for both the calibration and equalization DACs, either or both may have higher or lower resolution. Further, the numbers of differential elements provided to span the two ranges (equalizer and calibrator) may be different from those shown and may vary between the two DACs. Such an arrangement is discussed in the more specific example shown in FIGS. 11A-11C.

Reflecting on the lack of underlying calibration within the equalizer DAC in the bilateral output driver of FIGS. 6A and 6B, the equalizer DAC is nevertheless expected to provide the desired equalization range and resolution despite process variation. To accomplish this, the physical output driver may be implemented to meet the desired resolution at the slowest process corner and thus, $\alpha(1+\beta)W_{TERM}=\alpha W_{PHYS}$. One consequence of this implementation is that, for any process factor faster than the slowest process corner, the range of the equalizer will extend beyond that required. Moreover, due to the bilateral design of the output driver, the over-extension of the equalizer range will remain even after impedance calibration has been completed. That is, switching sub-driver branches within the impedance calibration portion of the output driver on or off does not affect the impedance of the equalizer DAC elements as it does in the hierarchical embodiments of FIGS. 2A, 3A and 4A.

In one embodiment, described in greater detail in reference to FIG. 7A, the lack of equalizer calibration is overcome by providing a feedback loop to drive the equalizer DAC output to a given target equalization voltage. In another embodiment shown in FIG. 8A, an equalizer calibration voltage corresponding to the maximum desired equalization ratio (i.e., portion of signal allocated to post-tap data) is provided to an equalizer calibration engine which, in turn, determines the equalizer setting corresponding to the full-scale equalization, and then scales the incoming equalization setting accordingly. In a third embodiment shown in FIG. 8B, the equalizer range is scaled by a factor determined during impedance calibration. For example, if $W_{PHYS}$ is determined to be 25% too large during impedance calibration (resulting in switching off a number of driver branches that correspond to $0.25W_{PHYS}$), then the full-scale equalizer setting is likewise scaled to 75% of the maximum possible setting, with each step through the equalizer range being likewise scaled by 75%.

FIG. 7A illustrates an impedance calibration engine together with a target-driven equalizer calibration engine, both integrated within an integrated circuit device that includes one or more bilateral output drivers $620_0$-$620_{N-1}$. The impedance calibration engine includes a pair of comparators 604, 606, pull-up voltage simulator 603, pull-down voltage simulator 605, finite state machine 609 (the "impedance calibration" state machine) and impedance-calibration driver 601. In a differential-element embodiment, the impedance calibration engine also includes pull-up and pull-down look-up tables 611a and 611b, although a single lookup-table may be sufficient if the impedances of counterpart pull-up and pull-down load elements within the bilateral output drivers are sufficiently similar. Also, though not specifically shown, the impedance-calibration driver 601 and output drivers 6200-620N-1 are implemented by output drivers that are substantially physically matched (e.g., in terms of physical width and number and configuration of impedance calibration branches) so that an impedance control value applied to the impedance-calibration driver 601 yields substantially the same impedance as when applied to the signal output drivers $620_0$-$620_{N-1}$.

FIG. 7B illustrates an exemplary impedance calibration operation for a pull-up output within the impedance calibration engine of FIG. 7A. Impedance calibration begins at 661 when control circuitry (e.g., host controller, on board CPU or other on-chip or off-chip control circuitry, not shown) asserts an impedance-calibration enable signal (e.g., ZCal_En=1) at an input of the impedance-calibration state machine 609. The control circuitry may also set the initial state of a calibration data bit (e.g., $d_{CAL}=0$, although state machine 609 may also initialize the state of the calibration data bit in response to assertion of the impedance-calibration enable signal).

In one embodiment, the impedance-calibration state machine 609 searches for a calibration setting that yields an output voltage, $V_{OUT}$, equal to or nearly equal to simulation voltage, $V_{SIM}$ (or a voltage that dithers about $V_{SIM}$) generated by one of voltage simulators 603, 605. To start, the impedance calibration state machine 609 sets control value, cal_pu (a four-bit value in this example) to midrange value $2^N/2$ at 663 (i.e., cal_pu=8 or 1000b in a 4-bit implementation), then reads the output of comparator 604 at 667. If, at decision block 667, the comparator output is determined to be high (indicating that the pull-up voltage, $V_{SIM}$, generated by pull-up voltage simulator 603 is greater than $V_{OUT}$ and thus that the pull-up impedance, $R_{PU}$, within calibration driver 601 is too high), the impedance-calibration state machine decrements $R_{PU}$ at 669 to increase $V_{OUT}$, then checks for convergence between $V_{OUT}$ and $V_{SIM}$ at 673. In one embodiment, for example, the impedance-calibration state machine deems $V_{OUT}$ to have converged to $V_{SIM}$ if the last X samples (X being a predetermined or programmed value) indicate a dithering of the comparator output and thus that calibration of the pull-up impedance is complete. If $V_{OUT}$ has not yet converged to $V_{SIM}$, the impedance-calibration state machine continues adjusting (decrementing or incrementing) $R_{PU}$ and checking for convergence. Otherwise, the state machine proceeds to calibrate the pull-down impedance, $R_{PD}$, switching $d_{cal}$ to '1' as shown at 675 (thus generating a pull-down output in an inverting output driver) and repeating the sequence of operations 663 and 673 using the output of comparator 606 to make up/down adjustment determinations and adjusting cal_pd[3:0] instead of cal_pu[3:0].

The target equalization calibrator includes an equalizing driver 640, finite state machine 643 (the "equalizer-calibration state machine"), comparator 641 and optional look-up table 645. The comparator 641 receives the output of equalizing driver 640 and a target equalization setting (e.g., a statically or dynamically determined threshold voltage, including a voltage level adaptively updated in response to detection of an incoming signal level or other run-time information). As shown in FIG. 7C, when enabled by assertion of an equalizer calibration-enable signal at 691 (e.g., EqCal_En=1, which may be accompanied by setting a pair of equalization data values that correspond to live post-tap and main data sources to '1' and '0' or vice-versa) state machine 643 sets an equalization control value, eq[3:0], to a mid-range value (e.g., 1000b in this 4-bit example) at 693. Thereafter, state machine 643 adjusts the equalization control value (eq[3:0]) up or down in response to the output state of comparator 641 (i.e., determined at 697), decreasing the equalizer control value at 699 if the output of equalization driver 640, $V_{EQ}$, is less than the target value, $V_{TARG}$, and increasing the equalizer control value at 701 if the equalizing driver output is greater than the target value. By this operation, the equalizer control loop (or servo loop) drives the equalizer control value to a state that minimizes the difference between the target EQ voltage and actual EQ voltage. As with the impedance calibration operation, state machine 643 may test for convergence of the target and actual equalization voltages at 703 by determining whether the output of comparator 641 is dithering between high and low values (i.e., indicating that the equalization voltage is toggling about the target voltage).

Although the impedance and equalization calibration operations described in reference to FIGS. 7A-7C may be carried out concurrently, adjustment of the impedance calibration may shift the equalizer setting for a given target. Accordingly, in one embodiment, the impedance calibration state machine signals the equalizer-calibration state machine upon converging to at least temporarily finalized impedance calibration settings, thus permitting the equalization-calibration state machine to begin assessing convergence. Also, where output drivers $620_0$-$620_{N-1}$ are implemented with differential-element impedance-calibration DACs, the pull-up and pull-down calibration control words may be supplied to respective impedance-calibration look-up tables 611a and 611b (or a shared lookup table) to obtain corresponding pull-up and pull-down enable values (e_pd and e_pu, each having a number of constituent bits according to the number of differential-element sub-drivers used to implement the impedance calibration function). As shown, such enable values are supplied to both the calibration driver 601 and the signal output drivers $620_0$-$620_{N-1}$ to establish a uniform calibration setting across the signaling interface. In an alternative embodiment, separate calibration values may be generated for all signal drivers. The equalizer control word may similarly be supplied to an equalizer lookup table 645 to obtain a selection signal s[5:0] that controls the data sources selected within a differential-element equalizer sub-driver. As with the Z-cal lookup-table, entries in the equalizer lookup table 645 may be stored in an order that provides a monotonic progression through the equalization range in response to progression of the equalization control word from a minimum to a maximum setting.

Figure 8A:
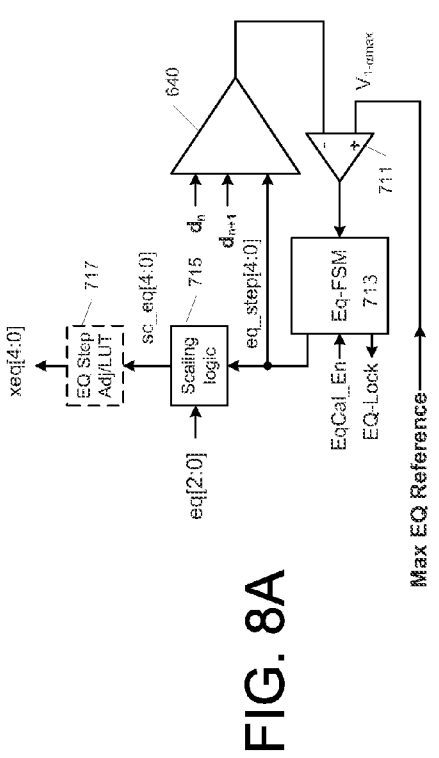
FIG. 8A illustrates an alternative embodiment of an equalization calibrator that may be used to calibrate the equalizing sub-driver in a bilateral output driver.

FIG. 8A illustrates an alternative embodiment of an equalization calibrator that may be used to calibrate the equalizing sub-driver in a bilateral output driver. Instead of a servo function that drives the equalizer output to a target, the equalization setting that corresponds to the maximum desired equalization is determined (i.e., a or its counterpart 1-a) and used to scale the overall equalization range. That is, if process variations yield a maximum desired equalization at, for example, 75% of the actual (i.e., physically available) equalization range, then all equalization settings across the entire desired range may be scaled to 75% of their counterparts in the actual range. Accordingly, state machine 713 adjusts and equalization step value up or down in accordance with the output of comparator 711 (comparing a maximum equalization voltage reference with the output of an equalization driver 640), applying the step value to equalization driver 640 and to scaling logic 715. By this operation, the equalization step value, eq_step[4:0] may be servo-adjusted to a value that corresponds to the top of scale (or whatever maximum equalization reference is provided). As shown, the top-of-scale equalization step value is also supplied to scaling logic 715 which, in response, scales the value of a 3-bit (e.g., 8-step or 6-step) equalization control value, eq[2:0], according to factor eq_step[m−1:0]/($2^m$−1), where 'm' is the number of bits in the equalization step value (5 bits in this example). The resulting, scaled equalization control value, sc_eq[4:0], may be applied directly to signal output drivers (e.g., in a uniform-element implementation) or to a differential-element lookup table 717 to choose differential-element sub-driver combinations corresponding to respective, scaled equalization control settings. By this operation, the equalizer is effectively calibrated according to the top-of-scale adjustment determined by the equalization feedback loop.

Figure 8B:
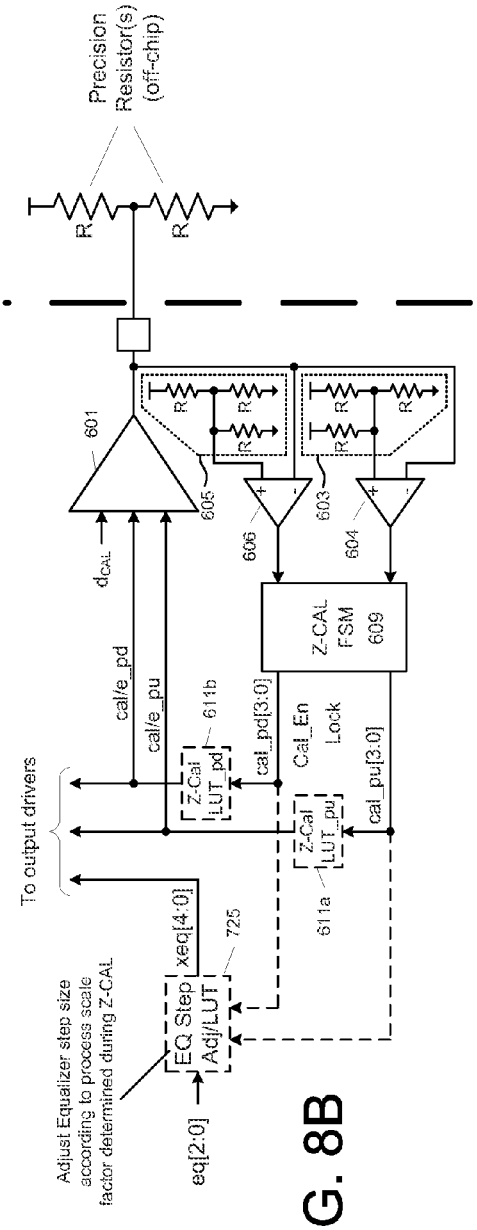
FIG. 8B illustrates an alternative equalizer scaling embodiment in which impedance calibration settings are supplied to the equalizer scaling logic and applied therein to estimate or determine the desired top-of-scale setting for the equalizer.

FIG. 8B illustrates an alternative equalizer scaling embodiment in which impedance calibration settings (e.g., cal_pu and/or cal_pd, each generated by an impedance calibration engine implemented as discussed in reference to FIGS. 7A and 7B) are supplied to equalizer scaling logic 725 and applied therein to estimate (or determine) the desired top-of-scale setting for the equalizer. By this arrangement, a separate equalization driver and equalization-calibration state machine may be obviated, reducing the overall footprint of the output driver calibration circuitry.

FIG. 9A illustrates an exemplary scaling engine or scaling logic 755 that may be used to implement scaling logic 715 of FIG. 8A or scaling logic 725 of FIG. 8B. As shown, scaling logic 755 includes a multiplexer 757 and table of scaled equalization step values 756 that operate to "look up" a scaled equalizer step size based upon eq_step[4:0] (i.e., generated in the embodiment of FIG. 8A) or cal_pd or cal_pu (i.e., generated in the embodiment of FIG. 8B). The scaled equalizer step size is multiplied with an incoming equalization control value, eq[2:0] in multiplier 759 to produce a scaled, expanded equalization control word, sc_eq[4:0] (or expanded equalization control word, xeq[4:0] if no further differential-element lookup is required). As shown, the equalization control value may be supplied from either a target equalization setting (e.g., a dynamically generated equalization level, adjusted in response to bit-error rate or other feedback sources) or from a configuration or mode register. In the particular example shown, for instance, the three-bit equalization control value establishes equalization steps corresponding to 5% of full-scale, and permits an equalization range from 0 to 30%. In one embodiment, the mode register (or a separate register) may include an equalization mode field ("eqm") which selects the equalization control source.

FIG. 9B illustrates an alternative scaling logic embodiment (or scaling engine) that additionally serves to select appropriate differential-element combinations for a given equalization_step[4:0] or cal_pd or cal_pu) and equalization control word. That is, one of 32 different sets of six (6) expanded equalization values are selected in accordance with the eq_step[4:0] setting (i.e., each of the six expanded equalization values except xeq0 being selected from a respective group of 32 values 781 via a corresponding multiplexer 783) and supplied to the six input ports of an output multiplexer 785, thus establishing a scaled set of six values that may be selected (i.e., by output multiplexer 785) in accordance with equalization control word eq[2:0].

FIG. 10A illustrates an exemplary implementation of a differential-element driver branch. More specifically, instead of implementing switching transistors with different sizes to establish relatively fine differential conductances from branch to branch, uniform switching transistors are used within each branch, and the lengths of respective polysilicon resistive elements are modulated (i.e., perturbed, adjusted, extended, etc.) to establish the branch-to-branch conductance differences. In the exemplary branch shown, a pull-up load element 803a having conductance $G_0$ (i.e., the minimum conductance of a set of differential pull-up elements) and pull-down load element 803b also having conductance $G_0$ are coupled between an output node 804 and respective voltage references (i.e., a supply voltage such as $V_{DD}$ or $V_{DDIO}$ and a ground reference). The pull-up load element 803a is formed by a series connection of a PMOS transistor 806 (i.e., Positive-type Metal-Oxide-Semiconductor transistor) and poly-silicon resistor 807 (a "poly" element), and the pull-down element 803b is similarly formed by a series connection of an NMOS transistor 808 (Negative-type MOS transistor) and poly element 809. The PMOS and NMOS transistors 806, 808 are nominally sized to present equal conductances, $G_{TR}$, so that the pull-up and pull-down poly elements 807, 809 may also be equally sized to present conductance $G_{0,POLY}$, where $G_0=G_{TR}*G_{0,POLY}/(G_{TR}+G_{0,POLY})$. Moreover, as shown in profile view 811 and top view 812 of load element 803a, the poly element 807 (which is coupled to the switching transistor 806, for example, through metal layer M1) may have a fixed width (e.g., minimum feature width) so that the net impedance of the poly element is proportional to its length (i.e., conductance inversely proportional to length). Accordingly, pull-up or pull-down elements having precisely controlled conductance steps ($\Delta_i$) within a differential-element DAC may be implemented by modulating the length of the poly elements from sub-driver branch to sub-driver branch. Thus, as shown by the comparison between the poly lengths of load elements within sub-driver branches $G_{N-2}$ and $G_{N-1}$, the net conductance between any two branch pull-up (or pull-down) elements may be effected by adjusting their respective poly-element lengths, such that $G_i-G_{i-1}$ (or $\Delta G_i - \Delta G_{i-1}$) is equal to the desired conductance difference between those two branches.

FIG. 10B illustrates an alternative implementation of a differential-element driver branch, in this case having three poly elements: pull-up and pull-down poly elements 822 and 823 each having a variable conductance $G_{i,PV}$ (i.e., a conductance that is length-modulated from branch to branch, and where 'i' is the sub-driver index and ranges from 0 to N−1), and a third, shared poly element 825 having conductance $G_{PF}$. By this arrangement, the overall footprint of the sub-driver branch may be reduced as sharing poly element 825 between the pull-up and pull-down portions of the branch obviates its replication in both the pull-up and pull-down portions of the sub-driver. In the particular example shown, the conductance of shared poly element 825 ($G_{PF}$) is fixed from sub-driver branch to sub-driver branch, so that the desired conductance for each sub-driver branch is effected by adjusting the length of the variable pull-up and pull-down poly elements 822, 823 (which may have a zero length and thus be non-existent to achieve the minimum sub-driver branch conductance, $G_0$) such that $G_{i,POLY}=G_{i,PV}+G_{PF}$ and $G_i=G_{TR}+G_{i,PV}+G_{PF}$, where the sub-driver index, 'i', ranges from 0 to N−1. In an alternative embodiment, shared poly element 825 may also (or alternatively) be varied from branch to branch to establish branch-to-branch conductance differences.

FIG. 11 illustrates circuit models that may be used to determine a set of differential-element impedances (or conductances) within a set of equalization sub-drivers 831 (i.e., $G_0$–$G_{N-1}$). As shown in circuit model 833 (depicting a circuit equivalent of sub-drivers 831 coupled to a signaling link 834 that exhibits characteristic impedance $R_{TERM}$ and/or is pulled up to $V_{TERM}$ by impedance, $R_{TERM}$), the various possible settings of selection value s[N−1:0] effects a range of voltage divider ratios (i.e., during a transmit interval in which $d_n \neq d_{n+1}$) through net pull-up and net pull-down loads, $R_{PU}$ and $R_{PD}$. Assuming a total equalizer impedance, $R_T$, equal to the parallel combination of pull-up and pull-down load elements, $R_{PU}*R_{PD}/(R_{PU}+R_{PD})$, and that the equalizer DAC is implemented by a set of N differential-element sub-drivers, the nominal conductance of each slice may be set approximately to $G=1/(N*R_T)$. The conductance of each slice may be expressed as $G_i=G+\Delta_i$, where $\Delta_0+\Delta_1+\ldots+\Delta_{N-1}=0$.

As can be seen from the Thevenin equivalent circuit at 835, the number of distinct equalization settings for a given quantity N of differential-element sub-drivers may be maximized by maximizing the quantity of unique $R_{PD}/R_{PU}$ values that may be achieved. Noting that $R_{PD}/R_{PU}$ may be expressed as:

$$(k/(N-k))*[1+N/(G*k*(N-k))*\text{sum}_k(\Delta_i)],$$

(where '*' denotes multiplication and $\text{sum}_k()$ is a summation function, in this case summing each of the $\Delta_i$ values included within the subset of k differential load elements), it follows that the maximum distinct quantity of $R_{PD}/R_{PU}$ values may be maximized by ensuring that each permutation $\text{sum}_k(\Delta_i)$ is distinct. In one embodiment, such a distinct set of permutations is achieved by using binary weights for $\Delta_i$ such that $\Delta_i=2^i\Delta$, where $\Delta$ is the unit conductance difference. In an arrangement having a nonzero sum of $\Delta_i$, the load element conductance, $G_i$ may be restated as $(G+\Delta_i)*G/(N*G+(2^N-1))$. In this case, $G_i$ may be normalized to yield a correct total conductance (or impedance), so that $\Delta_i=2^i\Delta-(2^N-1)/N$ and thus, $\Delta_i=2^i\Delta(n=1,\ldots,n-2)$, $\Delta_{N-1}=-2^{N-1}+1$.

In one embodiment, the foregoing principles may be applied determine a specific unit conductance and nominal conductance for a given set of N differential-element sub-drivers (where N may likewise be determined on the basis of the resolution necessary or on a trial and error basis (e.g., determining impedance values and resolution that result as N is stepped between minimum and maximum practicable values). Also, while described in the context of a voltage divider formed within an equalizing sub-driver, the approach may be applied to determine specific unit conductance and nominal conductance for a given set of N differential-element sub-drivers within an impedance calibrator.

Figure 12A:
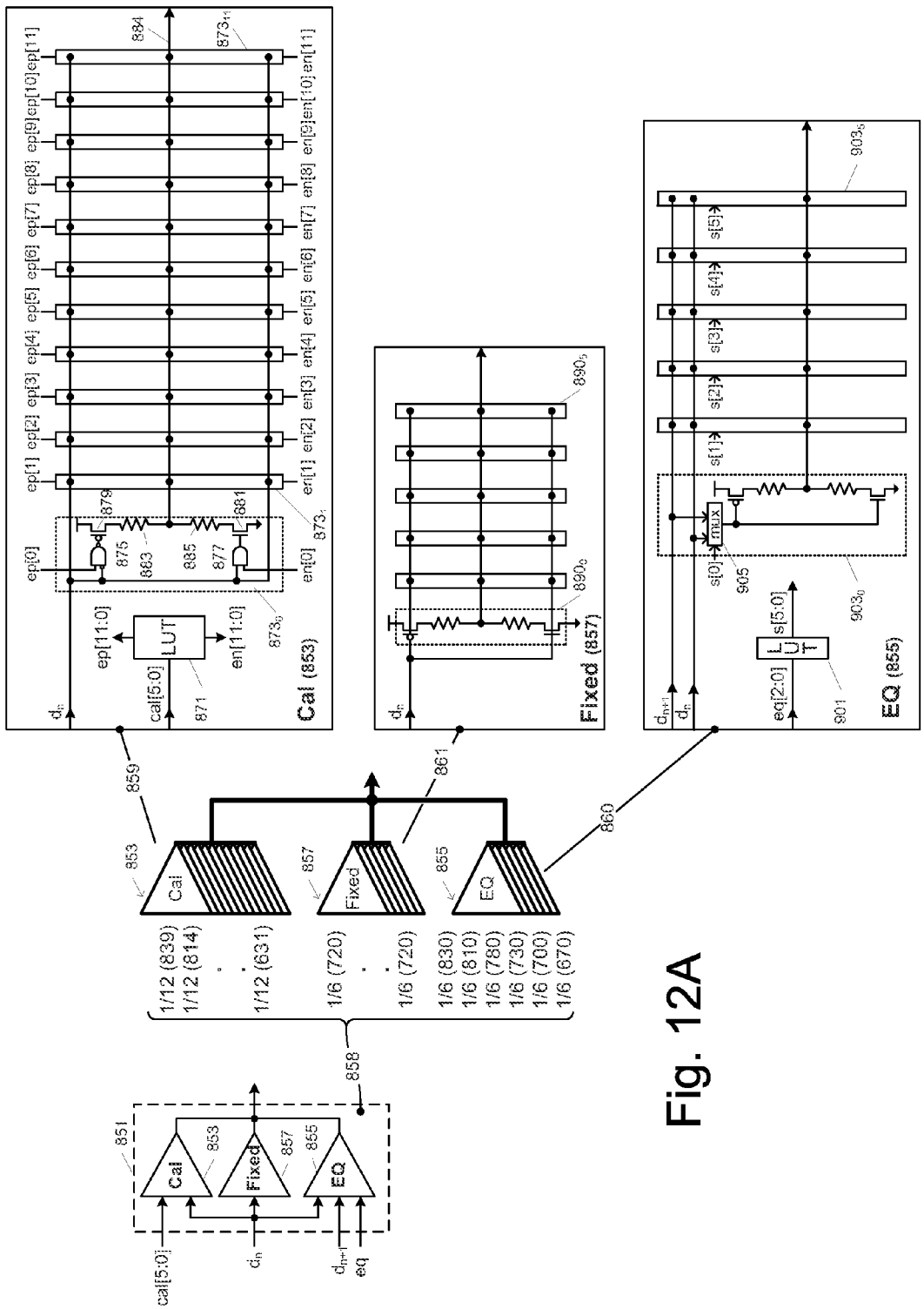
FIG. 12A illustrates an exemplary embodiment of a bilateral output driver having a differential-element impedance calibration DAC, a differential-element equalizer DAC and a set of fixed sub-drivers.

FIG. 12A illustrates an exemplary embodiment of a bilateral output driver 851 having a differential-element impedance calibration DAC 853, a differential-element equalizer DAC 855 and a set of fixed sub-drivers 857 (i.e., dedicated to main data transmission, and engaged during a data transmit interval regardless of the calibration setting). Referring to detail view 858, the impedance calibrator 853 is formed by a set of twelve sub-drivers that collectively provide 40-step calibration resolution. More specifically, as shown at 859, a 6-bit calibration control value, cal[5:0], is supplied to lookup-table 871, which responsively outputs a selected one of forty pairs of 12-bit enable values, ep[11:0] and en[11:0]. Individual pull-up and pull-down bits within the selected pair of enable values are supplied to respective differential-element driver branches $873_0$-$873_{11}$ (i.e., ep[0] and en[0] are supplied to driver branch $873_0$, ep[1] and en[1] are supplied to driver branch $873_1$ and so forth) to enable the set of pull-up and pull-down driver elements corresponding to a given state of the calibration control value. In one embodiment, the calibration control value may be incremented or decremented to progress step by step through the impedance range in separate calibration operations for the pull-up and pull-down portions of the calibration driver branches. Accordingly, the set of forty pull-up enable values ep[11:0] are stored in lookup-table 871 in an order to enable monotonic progression through the impedance range, and the set of forty pull-down enable values en[11:0] are likewise stored in order of monotonic impedance progression.

Still referring to detail view 859 of impedance-calibration DAC 853, the incoming main-tap data bit ($d_n$) is logically ANDed with enable values ep[i] and en[i] within each driver branch 873i (i.e., in NAND gate 875 and AND gate 877), thereby enabling a pull-up or pull-down output drive function. That is, when the incoming data bit is low and enable value ep[i] is high, the output of NAND gate 875 (having an inverting data input as shown) goes low to switch PMOS transistor 879 to a conducting state and thus switchably couple a load $G_i$ (formed by the conductance of PMOS transistor 879 and poly element 883) to output node 884. Conversely, when the incoming data bit is high and enable value en[i] is high, the output of AND gate 877 goes high to switch NMOS transistor 881 to a conducting state and thus switchably couple a load $G_i$ (formed by the conductance of NMOS transistor 881 and poly element 885) to output node 884. Accordingly, individual pull-up or pull-down load elements within the differential-element sub-drivers are switchably coupled to output node 884 in specific combinations selected by the incoming calibration value. Although an inverting sub-driver implementation is shown (i.e., output node 884 pulled high in response to logic-low data and pulled low in response to logic-high data), non-inverting implementations may alternatively be implemented (e.g., by removing the inversion at the data input to gate 875 and adding inversion at the data input to gate 877).

Turning to detail view 860 of differential-element equalizer DAC 855, an incoming two-bit equalization control value, eq[2:0], is used to lookup a 5-bit selection code, s[5:0], the constituent bits of which are supplied, respectively, to six differential-element sub-drivers $903_0$-$903_5$. As shown in the detail view of sub-driver $903_0$, each selection bit is used to select a data bit from either a post-tap or main-tap data source (i.e., $d_{n+1}$ or $d_n$) via multiplexer 905 (the output of which is coupled to PMOS and NMOS switching transistors to thereby couple either a pull-down or pull-up load element to the output node as generally discussed above), and thus span a desired equalization range.

Referring to detail view 861, the fixed sub-driver set 857 includes six uniform sub-driver branches $890_0$-$890_5$, each implemented by a data-switched pair of transistors and poly-silicon resistive elements as shown in the detail view of sub-driver $890_0$. Overall, the nominal impedance of the fixed sub-driver set is 120 ohms (i.e., 720 ohms per sub-driver branch), and the nominal impedance of the equalizer branch is also 120 ohms (though the latter is established by differential-element sub-drivers). The nominal impedance of each load element within the calibration sub-driver is 720 ohms, so that a set of six elements corresponding to a nominal midpoint in the calibration range (i.e., calibration control word=14 hex or 20 decimal) may be chosen to yield a nominal impedance of 120 ohms and thus establish the overall driver impedance at $R_{TERM}$=40 ohms. In the event of a slow process corner that yields a below-nominal conductance (i.e., impedance higher than target $R_{TERM}$), the calibration control value may be incremented from its starting (mid-range) value to transition to combinations of elements yielding a progressively higher net conductance, including selecting one or more combinations of six calibration sub-driver branches that exhibit an increased net conductance (i.e., relative to the initially selected combination of sub-drivers) and, if necessary, transitioning to larger numbers of enabled sub-driver branches. Conversely, in a fast process corner that yields an above-nominal conductance (i.e., impedance lower than target $R_{TERM}$), the calibration control value may be decremented from its starting value to transition the calibrator to combinations of elements that yield a progressively lower net conductance, including selecting one or more combinations of six sub-driver branches that exhibit a decreased net conductance and then, if necessary, transitioning to a smaller number of enabled sub-drivers. Overall, as the calibration control value is transitioned from the lowest to highest settings, impedance calibration spanning a range of $2\beta W_{PHYS}/(1+\beta)$ is achieved, thus enabling calibration of the overall bilateral output driver 851 over process variations ranging from +30% to −30%.

Figure 12B:
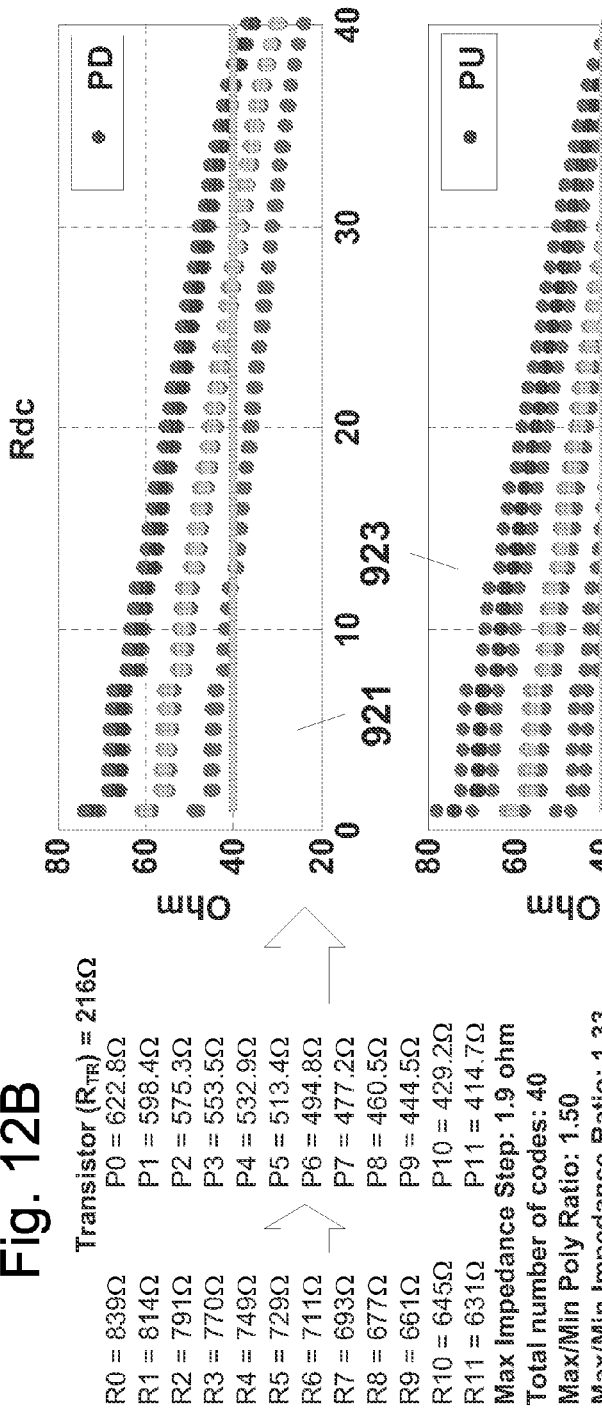
FIG. 12B illustrates the specific impedance values, R0-R12, that may be used to effect the calibration range described in reference to FIG. 12A.

FIG. 12B illustrates an exemplary set of load-element impedances, R0-R12, that may be used to quantize the impedance calibration range within the embodiment of FIG. 12A. As shown, each load-element has an impedance formed by a common transistor impedance (or resistance), $R_{TR}$, and a respective poly impedance, P0-P11. As discussed above, separate pull-up and pull-down poly elements (e.g., each having impedance Pi, where is the load-element index) may be provided within each differential-element sub-driver branch, though at least a portion of each poly element may be shared between the pull-up and pull-down load elements. More or fewer load-element impedances (i.e., more or fewer sub-drivers) and/or different impedance values for the provided load elements may be used in alternative embodiments. As shown in respective net-impedance profiles for the forty selectable combinations of pull-down load elements (profile 921) and the forty selectable combinations of pull-up load elements (profile 923), each showing the descending impedances (ascending conductances) for slow, nominal and fast process corners, a given code index (i.e., enable value) may be selected to yield the desired output driver impedance (40 ohms in this example) in all cases.

Figure 12C:
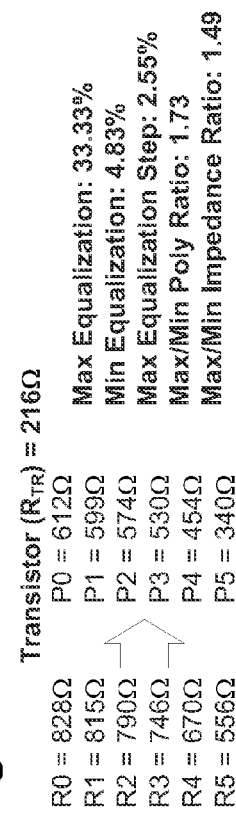
FIG. 12C illustrates an exemplary set of load-elements impedance, R0-R5, that may be used to quantize the equalization range within the embodiment of FIG. 12A.

FIG. 12C illustrates an exemplary set of load-element impedances, R0-R5, that may be used to quantize the equalization range within the embodiment of FIG. 12A. As with the load-element impedances used to implement the impedance-calibration DAC, each equalizer load-element may have be formed by a common transistor, having impedance $R_{TR}$, and a respective poly impedance, P0-P5. As discussed, separate pull-up and pull-down poly elements (e.g., each having impedance Pi, where i is the load-element index) may be provided within each differential-element sub-driver branch, though at least a portion of each poly element may be shared between the pull-up and pull-down load elements. More or fewer load-element impedances (i.e., more or fewer sub-drivers) and/or different impedance values for the provided load elements may be used in alternative embodiments.

It should be noted that the various circuits disclosed herein may be described using computer aided design tools and expressed (or represented), as data and/or instructions embodied in various computer-readable media, in terms of their behavioral, register transfer, logic component, transistor, layout geometries, and/or other characteristics. Formats of files and other objects in which such circuit expressions may be implemented include, but are not limited to, formats supporting behavioral languages such as C, Verilog, and VHDL, formats supporting register level description languages like RTL, and formats supporting geometry description languages such as GDSII, GDSIII, GDSIV, CIF, MEBES and any other suitable formats and languages. Computer-readable media in which such formatted data and/or instructions may be embodied include, but are not limited to, computer storage media in various forms (e.g., optical, magnetic or semiconductor storage media, whether independently distributed in that manner, or stored "in situ" in an operating system).

When received within a computer system via one or more computer-readable media, such data and/or instruction-based expressions of the above described circuits may be processed by a processing entity (e.g., one or more processors) within the computer system in conjunction with execution of one or more other computer programs including, without limitation, net-list generation programs, place and route programs and the like, to generate a representation or image of a physical manifestation of such circuits. Such representation or image may thereafter be used in device fabrication, for example, by enabling generation of one or more masks that are used to form various components of the circuits in a device fabrication process.

In the foregoing description and in the accompanying drawings, specific terminology and drawing symbols have been set forth to provide a thorough understanding of the present invention. In some instances, the terminology and symbols may imply specific details that are not required to practice the invention. For example, any of the specific numbers of bits, signal path widths, signaling or operating frequencies, component circuits or devices and the like may be different from those described above in alternative embodiments. Additionally, links or other interconnection between integrated circuit devices or internal circuit elements or blocks may be shown as buses or as single signal lines. Each of the buses may alternatively be a single signal line, and each of the single signal lines may alternatively be buses. Signals and signaling links, however shown or described, may be single-ended or differential. A signal driving circuit is said to "output" a signal to a signal receiving circuit when the signal driving circuit asserts (or deasserts, if explicitly stated or indicated by context) the signal on a signal line coupled between the signal driving and signal receiving circuits. The term "coupled" is used herein to express a direct connection as well as a connection through one or more intervening circuits or structures. Integrated circuit device "programming" may include, for example and without limitation, loading a control value into a register or other storage circuit within the device in response to a host instruction (and thus controlling an operational aspect of the device and/or establishing a device configuration) or through a one-time programming operation (e.g., blowing fuses within a configuration circuit during device production), and/or connecting one or more selected pins or other contact structures of the device to reference voltage lines (also referred to as strapping) to establish a particular device configuration or operation aspect of the device. The terms "exemplary" and "embodiment" are used to express an example, not a preference or requirement.

While the invention has been described with reference to specific embodiments thereof, it will be evident that various modifications and changes may be made thereto without departing from the broader spirit and scope. For example, features or aspects of any of the embodiments may be applied, at least where practicable, in combination with any other of the embodiments or in place of counterpart features or aspects thereof. Accordingly, the specification and drawings are to be regarded in an illustrative rather than a restrictive sense.

What is claimed is:

1. An output driver for use within an integrated circuit device, the output driver comprising:
    inputs to receive an impedance control value and an equalization control value;
    a plurality of impedance-calibration signal drivers coupled in parallel to a signal output node, the impedance-calibration drivers being selectively enabled based on the impedance control value such that each enabled one of the impedance-calibration signal drivers contributes a respective output signaling current corresponding to a first data input regardless of the equalization control value, the respective output signaling currents of the enabled impedance-calibration signal drivers constituting an entirety of signaling currents contributed to calibrate an impedance of the output driver; and
    a plurality of equalization signal drivers coupled to the signal output node in parallel with the plurality of impedance-calibration signal drivers, wherein first and second subsets of the plurality of equalization signal drivers are selected in accordance with the equalization control value and contribute respective output signaling currents regardless of the impedance control value, each of the first subset of the plurality of equalization signal drivers contributing a respective output signaling current corresponding to the first data input and each of the second subset of the plurality of equalization signal drivers contributing a respective output signaling current corresponding to a second data input.

2. The output driver of claim 1 wherein each of the impedance-calibration signal drivers has an impedance that is set to be different from each of the other impedance-calibration signal drivers and substantially smaller than a stepwise increment of the output driver impedance achievable by incrementing the impedance control value.

3. The output driver of claim 1 wherein one of the impedance-calibration signal drivers has an impedance substantially equal to a stepwise increment of the output driver impedance achievable by incrementing the impedance control value.

4. The output driver of claim 1 wherein each of the equalization signal drivers contributes a respective output signaling current that is intentionally different from the output signaling current contributed by any of the other equalization signal drivers and that is substantially larger than a stepwise increment of the output driver current to be achieved by incrementing the equalization control value.

5. The output driver of claim 1 wherein one of the equalization signal drivers contributes a signaling current substantially equal to a stepwise increment of the output driver current to be achieved by incrementing the equalization control value.

6. The output driver of claim 1 wherein the impedance control value has a number of constituent bits that is less than the number of impedance-calibration signal drivers, the output driver further comprising first decoding logic to convert the impedance control value to an enable value having a number of constituent bits equal to the number impedance-calibration signal drivers.

7. The output driver of claim 6 wherein the enable value is supplied to at least one other output driver to control the impedance of the at least one other output driver.

8. The output driver of claim 6 wherein the first decoding logic comprises a look-up table having a plurality of enable values stored therein.

9. The output driver of claim 6 wherein the equalization control value has a number of constituent bits that is less than the number of equalization signal drivers, the output driver further comprising second decoding logic to convert the equalization control value to a select value having a number of constituent bits equal to the number of equalization signal drivers.

10. An output driver for use within an integrated circuit device, the output driver comprising a first plurality of impedance-calibration signal drivers coupled in parallel to a signal output node to enable an impedance of the output driver to be adjusted in stepwise impedance increments in response to an increase in a first impedance control value, wherein each impedance-calibration signal driver of the first plurality of impedance-calibration signal drivers comprises an impedance substantially smaller than a given one of the stepwise impedance increments.

11. The output driver of claim 10 wherein the output driver is configured to enable a subset of the first plurality of impedance-calibration signal drivers in accordance with the first impedance control value, the output driver further comprising a multiplexer to select a data bit to be output by the enabled subset of the first plurality of impedance-calibration signal drivers from either a first data source or a second data source.

12. The output driver of claim 10 further comprising a second plurality of impedance-calibration signal drivers coupled in parallel to the signal output node, wherein the first plurality of impedance-calibration signal drivers constitute a first sub-driver within an equalization signal driver and wherein the second plurality of impedance-calibration signal drivers constitute a second sub-driver within the equalization signal driver.

13. The output driver of claim 12 further comprising an input to receive an equalization control value, wherein a first bit of the equalization control value is supplied to the first sub-driver to select either a first data bit or a second data bit to be output by an enabled subset of the first plurality of impedance-calibration signal drivers, and a second bit of the equalization control value is supplied to the second sub-driver to select either the first data bit or the second data bit to be output by an enabled subset of the second plurality of impedance-calibration signal drivers.

14. The output driver of claim 13 further comprising first and second impedance-control inputs to receive the first impedance-control value and a second impedance-control value, respectively, wherein the first impedance-control value selects the enabled subset of the first plurality of impedance-calibration signal drivers, and the second impedance-control value selects the enabled subset of the second plurality of impedance-calibration signal drivers.

15. A method of operating an output driver within an integrated circuit device, the method comprising:
receiving an impedance control value and an equalization control value;
selectively enabling impedance-calibration signal drivers to contribute respective output signaling currents to a signal output node based, at least in part, on the impedance control value and without regard to the equalization control value, the respective output signaling currents of the enabled impedance-calibration signal drivers constituting an entirety of signaling currents contributed to calibrate an impedance of the output driver; and
coupling selected first and second subsets of a plurality of equalization signal drivers to respective ones of first and second transmit data sources in response to the equalization control value to establish a desired equalization setting of the output driver, each of the plurality equalization signal drivers being enabled to contribute a respective output current to the output node without regard to the impedance control value.

16. The method of claim 15 wherein coupling the selected first and second subsets of equalization signal drivers to respective ones of the first and second transmit data sources comprises adjusting an equalization control value to generate an output equalization voltage that corresponds to the target equalization voltage.

17. The method of claim 15 wherein coupling the selected first and second subsets of equalization signal drivers to respective ones of first and second data sources comprises:
determining a scale factor that corresponds to a ratio of a desired equalization voltage and a generated equalization voltage that results from a first equalization setting; and
scaling an equalization control value supplied to the equalization signal drivers in accordance with the scale factor.

18. The method of claim 15 wherein coupling the selected first and second subsets of equalization signal drivers to respective ones of the first transmit data source or a second transmit data source comprises scaling an equalization control value supplied to the equalization signal drivers in accordance with a ratio of the impedance control value and a maximum possible value of the impedance control value.

19. A method of operating an output driver within an integrated circuit device, the method comprising:
incrementing a first impedance control value; and
selectively enabling respective combinations of impedance-calibration signal drivers in response to incrementing the impedance control value to achieve stepwise increments in an impedance of the output driver, wherein each enabled combination of impedance-calibration signal drivers yields a different output driver impedance than the other enabled combinations of impedance-calibration signal drivers, and wherein each impedance-calibration signal driver exhibits an individual impedance substantially smaller than the stepwise impedance increments.

20. The method of claim 19 wherein selectively enabling respective combinations of impedance-calibration signal drivers in response to incrementing the impedance control value comprises looking up a respective enable value in response to each increment of the impedance control value, each enable value corresponding to a respective one of the combinations of impedance-calibration signal drivers.

21. The method of claim 20 wherein the enable value comprises more constituent bits than the impedance control value.

22. The method of claim 20 wherein the impedance control value comprises fewer constituent bits than the number of impedance-calibration signal drivers and wherein the enable value comprises a number of constituent bits that matches the number of impedance-calibration signal drivers.

23. An output driver for use within an integrated circuit device, the output driver comprising a plurality of equalization signal drivers coupled in parallel to a signal output node to enable an equalization setting of the output driver to be adjusted in stepwise equalization increments in response to incrementing an equalization control value, wherein each equalization signal driver of the plurality of equalization signal drivers produces an equalization contribution substantially larger than a given one of the stepwise equalization increments.

24. The output driver of claim 23 further comprising a multiplexer to select a data bit to be output by an enabled subset of the plurality of equalization signal drivers from either a first data source or a second data source.

25. The output driver of claim 23 further comprising a plurality of impedance-calibration signal drivers coupled to the signal output node in parallel with the plurality of equalization signal drivers.

26. An integrated circuit device comprising:
means for incrementing a first impedance control value; and
means selectively enabling respective combinations of impedance-calibration signal drivers in response to incrementing the impedance control value to achieve stepwise increments in an impedance of an output driver, wherein each enabled combination of impedance-calibration signal drivers yields a different output driver impedance than the other enabled combinations of impedance-calibration signal drivers, and wherein each impedance-calibration signal driver exhibits an individual impedance substantially smaller than the stepwise impedance increments.

* * * * *